(12) United States Patent
Sonoda et al.

(10) Patent No.: US 9,714,466 B2
(45) Date of Patent: Jul. 25, 2017

(54) VAPOR DEPOSITION DEVICE, VAPOR DEPOSITION METHOD, AND METHOD OF MANUFACTURING ORGANIC ELECTROLUMINESCENT DISPLAY DEVICE

(71) Applicant: Sharp Kabushiki Kaisha, Osaka (JP)

(72) Inventors: Tohru Sonoda, Osaka (JP); Shinichi Kawato, Osaka (JP); Satoshi Inoue, Osaka (JP); Satoshi Hashimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 381 days.

(21) Appl. No.: 14/452,470

(22) Filed: Aug. 5, 2014

(65) Prior Publication Data

US 2014/0345527 A1 Nov. 27, 2014

Related U.S. Application Data

(63) Continuation of application No. 13/997,173, filed as application No. PCT/JP2011/079294 on Dec. 19, 2011, now Pat. No. 8,845,808.

(30) Foreign Application Priority Data

Dec. 24, 2010 (JP) ................................. 2010-288814

(51) Int. Cl.
*C23C 16/455* (2006.01)
*C23C 14/24* (2006.01)
(Continued)

(52) U.S. Cl.
CPC ........ *C23C 16/45578* (2013.01); *C23C 14/24* (2013.01); *C23C 14/243* (2013.01);
(Continued)

(58) Field of Classification Search
CPC . C23C 16/45578; C23C 14/242; C23C 14/43; C23C 14/246; C23C 14/26; C23C 14/542
(Continued)

(56) References Cited

U.S. PATENT DOCUMENTS 2,402,475 A 6/1946 Waterbury et al.
5,122,389 A 6/1992 Yasunaga
(Continued)

FOREIGN PATENT DOCUMENTS

JP 8-227276 A 9/1996
JP 10-152777 A 6/1998
(Continued)

OTHER PUBLICATIONS

International Search Report received for PCT Application No. PCT/JP2011/079294, mailed on Jan. 31, 2012, 7 pages (4 pages of English Translation and 3 pages of PCT Search Report.
(Continued)

*Primary Examiner* — Gordon R Baldwin
*Assistant Examiner* — Aiden Lee
(74) *Attorney, Agent, or Firm* — Morrison & Foerster LLP

(57) ABSTRACT

A vapor deposition device (50) in accordance with the present invention is a vapor deposition device for forming a film on a film formation substrate (60), the vapor deposition device including a vapor deposition source (80) that has an injection hole (81) from which vapor deposition particles are injected, a vapor deposition particle crucible (82) for supplying the vapor deposition particles to the vapor deposition source (80), and a rotation motor (86) for changing a distribution of the injection amount of the vapor deposition particles by rotating the vapor deposition source (80).

12 Claims, 14 Drawing Sheets

(51) Int. Cl.
*H05B 33/10* (2006.01)
*H01L 21/02* (2006.01)
*H01L 51/56* (2006.01)
*H01L 51/00* (2006.01)

(52) U.S. Cl.
CPC ....... *H01L 21/02263* (2013.01); *H05B 33/10* (2013.01); *H01L 51/001* (2013.01); *H01L 51/56* (2013.01)

(58) Field of Classification Search
USPC .................................. 118/723 VE, 726, 727
See application file for complete search history.

(56) References Cited

U.S. PATENT DOCUMENTS

| | | | |
|---|---|---|---|
| 5,532,102 A | 7/1996 | Soden et al. | |
| 5,742,129 A | 4/1998 | Nagayama et al. | |
| 6,294,892 B1 | 9/2001 | Utsugi et al. | |
| 7,819,975 B2 | 10/2010 | Ryu | |
| 2003/0047817 A1 | 3/2003 | Kim | |
| 2003/0168013 A1 | 9/2003 | Freeman et al. | |
| 2005/0126493 A1* | 6/2005 | Jeong | C23C 14/243 118/726 |
| 2005/0147753 A1* | 7/2005 | Smith | C23C 14/243 427/249.1 |
| 2006/0099820 A1 | 5/2006 | Ryu | |
| 2007/0178708 A1 | 8/2007 | Ukigaya | |
| 2009/0130794 A1* | 5/2009 | Probst | C23C 14/243 438/84 |
| 2010/0080901 A1 | 4/2010 | Hein et al. | |
| 2010/0186812 A1 | 7/2010 | Eaglesham | |

FOREIGN PATENT DOCUMENTS

| | | |
|---|---|---|
| JP | 2000-188179 A | 7/2000 |
| JP | 2002-249868 A | 9/2002 |
| JP | 2006-131993 A | 5/2006 |
| JP | 2007-227359 A | 9/2007 |
| JP | 2007-332458 A | 12/2007 |
| JP | 2008-150649 A | 7/2008 |
| JP | 2009-97044 A | 5/2009 |

OTHER PUBLICATIONS

Restriction Requirement received for U.S. Appl. No. 13/997,173, Notification date: Feb. 28, 2014, 10 pages.
Notice of Allowance received for U.S. Appl. No. 13/997,173. Notification date: May 23, 2014, 22 pages.

* cited by examiner

FIG. 3
(a)
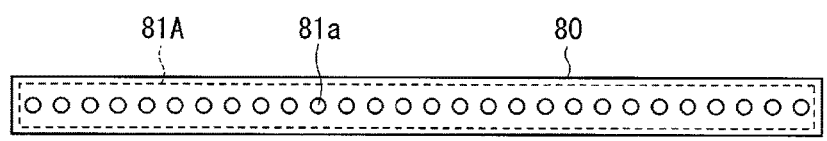
(b)
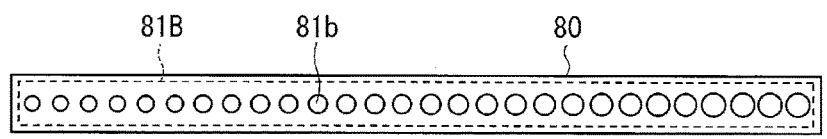
(c)
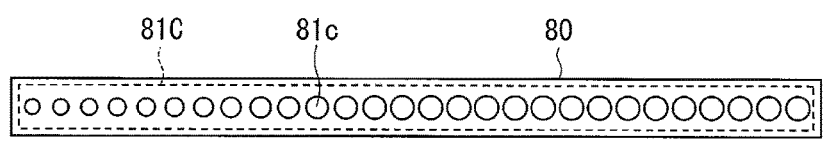

F I G. 1 1
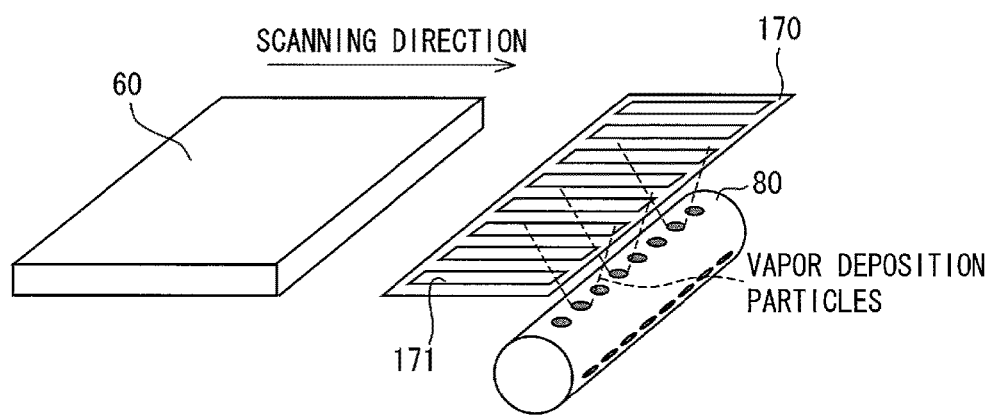

F I G. 1 7
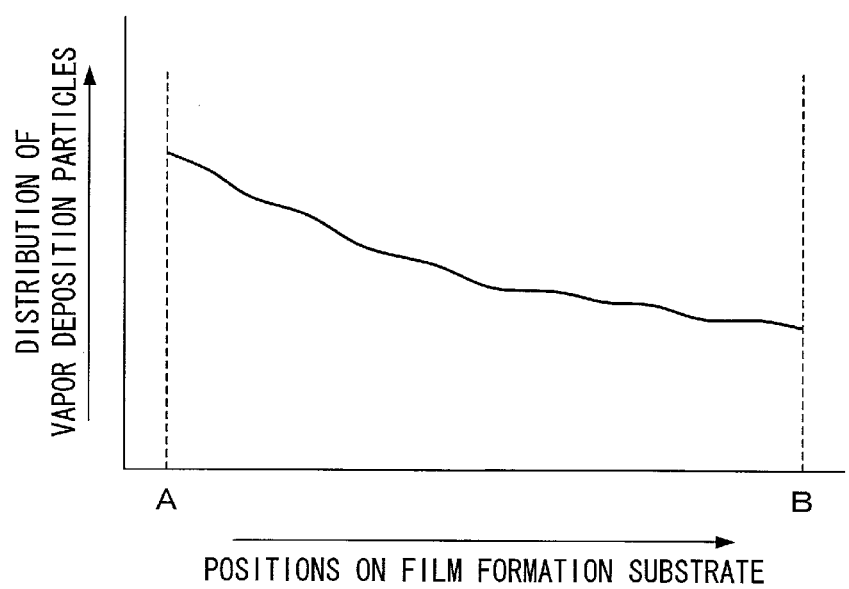

VAPOR DEPOSITION DEVICE, VAPOR DEPOSITION METHOD, AND METHOD OF MANUFACTURING ORGANIC ELECTROLUMINESCENT DISPLAY DEVICE

CROSS REFERENCE TO RELATED APPLICATIONS

This is a Continuation of U.S. patent application Ser. No. 13/997,173, claiming a filing date of Dec. 19, 2011, which is a U.S. National Phase patent application of PCT/JP2011/079294, filed Dec. 19, 2011, which claims priority to Japanese patent application no. 2010-288814, filed Dec. 24, 2010, each of which is hereby incorporated by reference in the present disclosure in its entirety.

TECHNICAL FIELD

The present invention relates to a vapor deposition device, and a vapor deposition method, each of which employs a vacuum vapor deposition method, and a method for producing an organic electroluminescent display device with use of the vapor deposition device by the vapor deposition method.

BACKGROUND ART

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic electroluminescence (hereinafter abbreviated to "EL") element which uses EL of an organic material and that (ii) is an all-solid-state flat-panel display which is excellent in, for example, low-voltage driving, high-speed response, and self-emitting.

An organic EL display device includes, for example, (i) a substrate made up of members such as a glass substrate and TFTs (thin film transistors) provided to the glass substrate and (ii) organic EL elements provided on the substrate and connected to the TFTs.

An organic EL element is a light-emitting element capable of emitting high-luminance light emission based on low-voltage direct-current driving, and includes in its structure a first electrode, an organic EL layer, and a second electrode stacked on top of one another in that order, the first electrode being connected to a TFT. The organic EL layer between the first electrode and the second electrode is an organic layer including a stack of layers such as a hole injection layer, a hole transfer layer, an electron blocking layer, a luminescent layer, a hole blocking layer, an electron transfer layer, and an electron injection layer.

A full-color organic EL display device typically includes, as sub-pixels aligned on a substrate, organic EL elements including luminescent layers of red (R), green (G), and blue (B). The full-color organic EL display device carries out a color image display by, with use of TFTs, selectively causing the organic EL elements to emit light with a desired luminance.

In order to produce an organic EL display device, it is therefore necessary to form, for each organic EL element, a luminescent layer of a predetermined pattern made of an organic luminescent material which emits light of the colors. A layer that is not required to be patterned in shapes for respective organic EL elements is formed collectively in an entire pixel region constituted by the organic EL elements.

Such formation of a luminescent layer of a predetermined pattern is performed by a method such as (i) a vacuum vapor deposition method, (ii) an inkjet method, and (iii) a laser transfer method. The production of, for example, a low-molecular organic EL display (OLED) often uses a vacuum vapor deposition method (for example, Patent Literatures 1 and 2).

The vacuum vapor deposition method uses a mask (also called a vapor deposition mask or a shadow mask) provided with openings of a predetermined pattern. The mask is fixed in close contact with a vapor-deposited surface of a substrate which vapor-deposited surface faces a vapor deposition source. Then, vapor deposition particles (film formation material) are injected from the vapor deposition source so as to be deposited on the vapor-deposited surface through openings of the mask. This forms a thin film of a predetermined pattern. The vapor deposition is carried out for each color of a luminescent layer. This is called "selective vapor deposition".

The following description discusses, with reference to FIGS. 15 and 16, a configuration of a conventional vapor deposition device which employs the vacuum vapor deposition method.

FIG. 15 is a side view schematically illustrating a configuration of a conventional vapor deposition device 250. FIG. 16 is a perspective view schematically illustrating configurations of a vapor deposition source 280, a vapor deposition source crucible 282 and a pipe 283, which are included in the vapor deposition device 250.

As illustrated in FIG. 15, the vapor deposition device 250 is a device for forming a film on a film formation substrate 260. The vapor deposition device 250 includes a shadow mask 270, the vapor deposition source 280, the vapor deposition source crucible 282, and the pipe 283. The shadow mask 270 and the vapor deposition source 280 are provided in a vacuum chamber 290, and the vapor deposition source crucible 282 is fixed to a support (not illustrated).

The vapor deposition source 280 has a plurality of injection holes (nozzles) 281 from which vapor deposition particles are injected. As illustrated in FIG. 15, the injection holes 281 are arranged in a line.

The vapor deposition source crucible 282 contains a vapor deposition material which is in solid or liquid form. The vapor deposition material in solid or liquid form is heated in the vapor deposition source crucible 282 so as to be gaseous vapor deposition particles, and supplied (introduced) to the vapor deposition source 280 via the pipe 283. The pipe 283 is connected to the vapor deposition source 280 at an end (supply-side end) where one end of the line of the injection holes 281 is located. The vapor deposition particles thus supplied to the vapor deposition source 280 are injected from the injection holes 281. Note that the pipe 283 is heated to such a temperature that the vapor deposition particles do not adhere to the pipe 283.

The film formation substrate 260 and the vapor deposition source 280 are arranged such that a vapor-deposited surface of the film formation substrate 260 faces the vapor deposition source 280. The shadow mask 270, which has an opening corresponding to a pattern of a vapor deposition region, is attached tightly to the vapor-deposited surface of the film formation substrate 260 so that no vapor deposition particles adhere to a region other than the vapor deposition region.

According to the above configuration, the film formation substrate 260 and the shadow mask 270 are moved (scanned) relative to the vapor deposition source 280 while the vapor deposition particles are being injected from the injection holes 281. This forms a predetermined pattern on the film formation substrate 260.

CITATION LIST

Patent Literature

Patent Literature 1
Japanese Patent Application Publication, Tokukaihei, No. 8-227276 (1996) A (Publication Date: Sep. 3, 1996)
Patent Literature 2
Japanese Patent Application Publication, Tokukai, No. 2000-188179 A (Publication Date: Jul. 4, 2000)

SUMMARY OF INVENTION

Technical Problem

However, the conventional techniques as described above may cause nonuniformity in distribution of film thickness of a vapor-deposited film.

FIG. 17 is a graph illustrating a relationship between (i) positions on the film formation substrate 260 along a direction in which the injection holes 281 are arranged and (ii) distribution (thickness) of vapor deposition particles. It is assumed in this graph that (i) a position facing the supply-side end of the vapor deposition source 280 is a position A and (ii) a position facing the other end opposite to the supply-side end of the vapor deposition source 280 is a position B.

In the vapor deposition source 280, vapor deposition particles are influenced by pressure difference, internal shapes, and conductance etc. in supply paths and injection holes. Therefore, different amounts of vapor deposition particles are injected from the injection holes 281. Specifically, since vapor deposition particles are injected sequentially from an injection hole 281 that is close to the supply side-end, density of the vapor deposition particles decreases with increasing distance from the supply-side end. This results in a pressure difference inside the vapor deposition source 280. Therefore, the amount of the vapor deposition particles injected from the injection holes 281 tends to decrease with increasing distance from the supply-side end of the vapor deposition source 280. Furthermore, a distribution of the density of the vapor deposition particles changes in a complicated manner depending on the kind of vapor deposition particles, variations in sizes of the injection holes, variations in shapes of the supply paths, and a temperature distribution in the vapor deposition source etc.

As a result, a vapor-deposited film on the film formation substrate 260, which film is composed of vapor deposition particles injected from various injection holes 281, also contains different amounts of vapor deposition particles depending on the positions on a surface of the substrate (see FIG. 17). This causes nonuniformity in film thickness distribution across the surface of the substrate.

In particular, an organic EL element has a light-emitting property that is highly sensitive to the film thickness of a deposited organic film. Therefore, a variation in the film thickness of the organic film across a screen of an organic EL display device directly leads to display unevenness and nonuniform life property. In view of this, it is preferable to uniformly deposit a luminescent layer of the organic EL element as much as possible.

Note that it is also possible to control the amount of vapor deposition particles to be injected from each injection hole by changing the opening size (diameter) of that injection hole. However, such a control requires high accuracy when making injection holes, and thus leads to an increase in production cost for the vapor deposition source. In addition, the distribution of vapor deposition particles changes dynamically. Therefore, it is difficult to cause vapor deposition particles to be injected from the injection holes in equal amounts only by changing the sizes of the injection holes.

The present invention has been made in view of the above problems, and an object of the present invention is to provide a vapor deposition device and a vapor deposition method each of which is capable of vapor deposition of vapor deposition particles on a film formation substrate such that a film made of the vapor deposition particles has a uniform thickness.

Solution to Problem

In order to attain the above object, a vapor deposition device in accordance with the present invention is a vapor deposition device for forming a film on a film formation substrate, the vapor deposition device including: a vapor deposition source that has an injection hole from which vapor deposition particles are injected; vapor deposition particle supplying means for supplying the vapor deposition particles to the vapor deposition source; and injection amount controlling means for changing a distribution of an injection amount of the vapor deposition particles.

In order to attain the above object, a vapor deposition method in accordance with the present invention is a vapor deposition method for forming a film on a film formation substrate, including the steps of: (a) controlling a distribution of an injection amount of vapor deposition particles injected from an injection hole in a vapor deposition source; (b) injecting the vapor deposition particles towards the film formation substrate from the injection hole while supplying the vapor deposition particles to the vapor deposition source; and (c) performing each of the steps (a) and (b) one or more times.

According to the above vapor deposition device and the vapor deposition method, the vapor deposition particles are supplied from the vapor deposition particle supplying means to the vapor deposition source, and injected from the injection holes towards the film formation substrate. Note, here, that the film thickness distribution of the vapor deposition particles deposited by one (1) vapor deposition is usually nonuniform. In this regard, by performing vapor deposition onto the film formation substrate a plurality of times while changing the distribution of the injection amount of vapor deposition particles, it is possible to cause film thickness distributions to compensate for each other. As such, it is possible to provide a vapor deposition device and a vapor deposition method each of which is capable of vapor deposition of vapor deposition particles on a film formation substrate such that a film made of the vapor deposition particles has a uniform thickness.

A method for producing an organic electroluminescent display device of the present invention, including the steps of: (A) forming a first electrode on a TFT substrate; (B) depositing, over the TFT substrate, an organic layer including at least a luminescent layer; (C) depositing a second electrode; and (D) sealing, with a sealing member, an organic electroluminescent element including the organic layer and the second electrode, at least one of the steps (B), (C) and (D) including the steps (b), (a) and (c) of the vapor deposition method.

According to the arrangement, it is possible, by a vapor deposition method in accordance with the present invention, to form an organic layer etc. having a uniform film thickness. This makes it possible to provide an organic electroluminescent display device which causes less display unevenness.

Advantageous Effects of Invention

As described above, a vapor deposition device in accordance with the present invention is a vapor deposition device for forming a film on a film formation substrate, the vapor deposition device including: a vapor deposition source that has an injection hole from which vapor deposition particles are injected; vapor deposition particle supplying means for supplying the vapor deposition particles to the vapor deposition source; and injection amount controlling means for changing a distribution of an injection amount of the vapor deposition particles. Furthermore, a vapor deposition method in accordance with the present invention is a vapor deposition method for forming a film on a film formation substrate, including the steps of: (a) controlling a distribution of an injection amount of vapor deposition particles injected from an injection hole in a vapor deposition source; (b) injecting the vapor deposition particles towards the film formation substrate from the injection hole while supplying the vapor deposition particles to the vapor deposition source; and (c) performing each of the steps (a) and (b) one or more times. Therefore, it is possible to provide a vapor deposition device and a vapor deposition method each of which is capable of vapor deposition of vapor deposition particles on a film formation substrate such that a film made of the vapor deposition particles has a uniform thickness.

(a), (b) and (c) of FIG. 3 are plan views each illustrating an example of a line of injection holes in a side face of a vapor deposition source.

Figure 4:
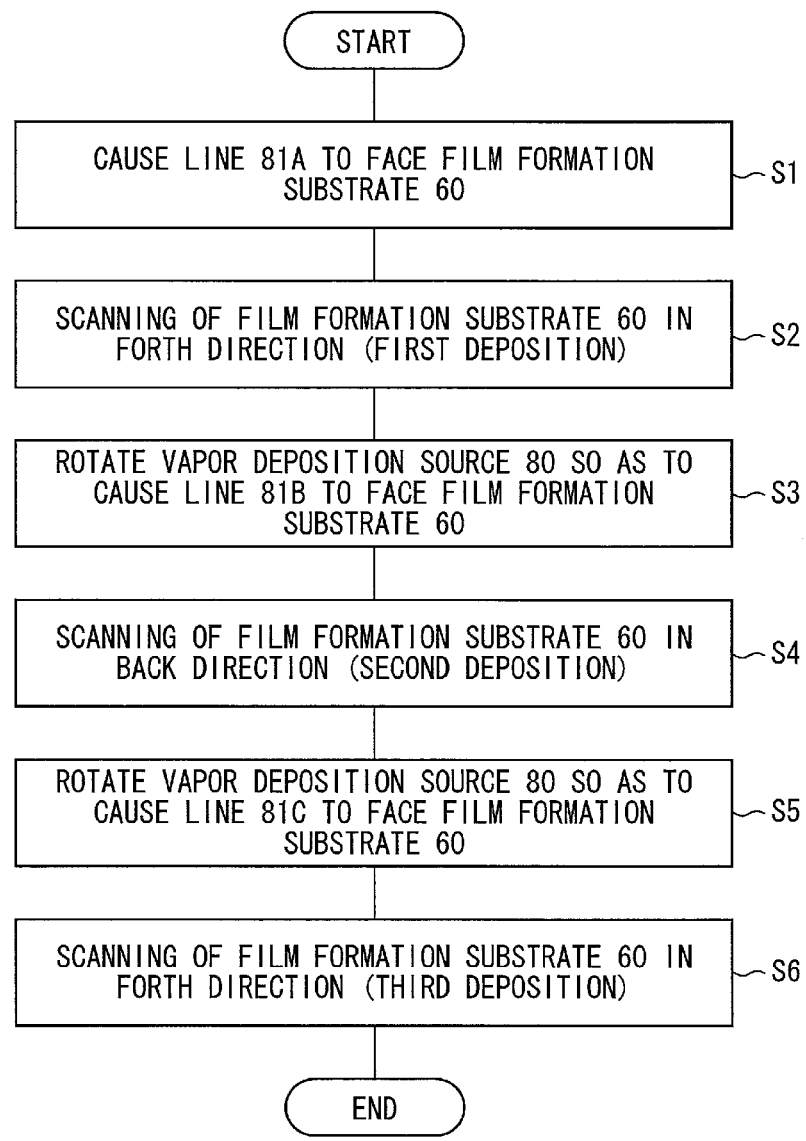

FIG. 4 is a flowchart showing successive steps of vapor deposition on a film formation substrate.

Figure 5:
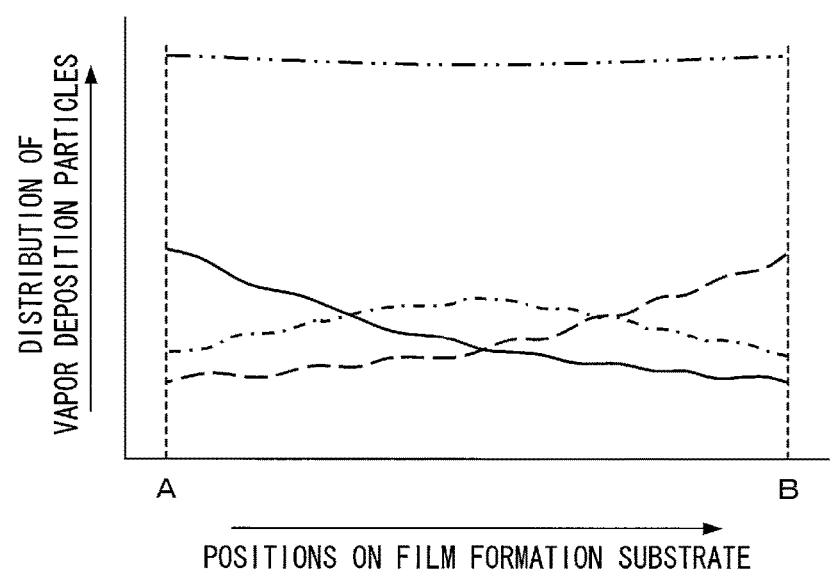

FIG. 5 is a graph illustrating a relationship between (i) positions on a film formation substrate along a direction in which the injection holes are arranged and (ii) distribution (thickness) of vapor deposition particles.

Figure 6:
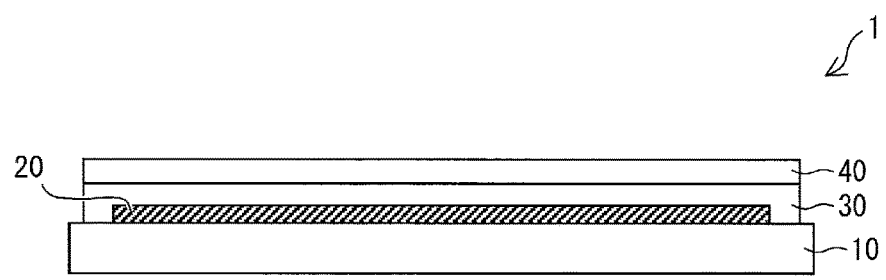

FIG. 6 is a cross-sectional view schematically illustrating a configuration of an organic EL display device for carrying out an RGB full-color display.

Figure 7:
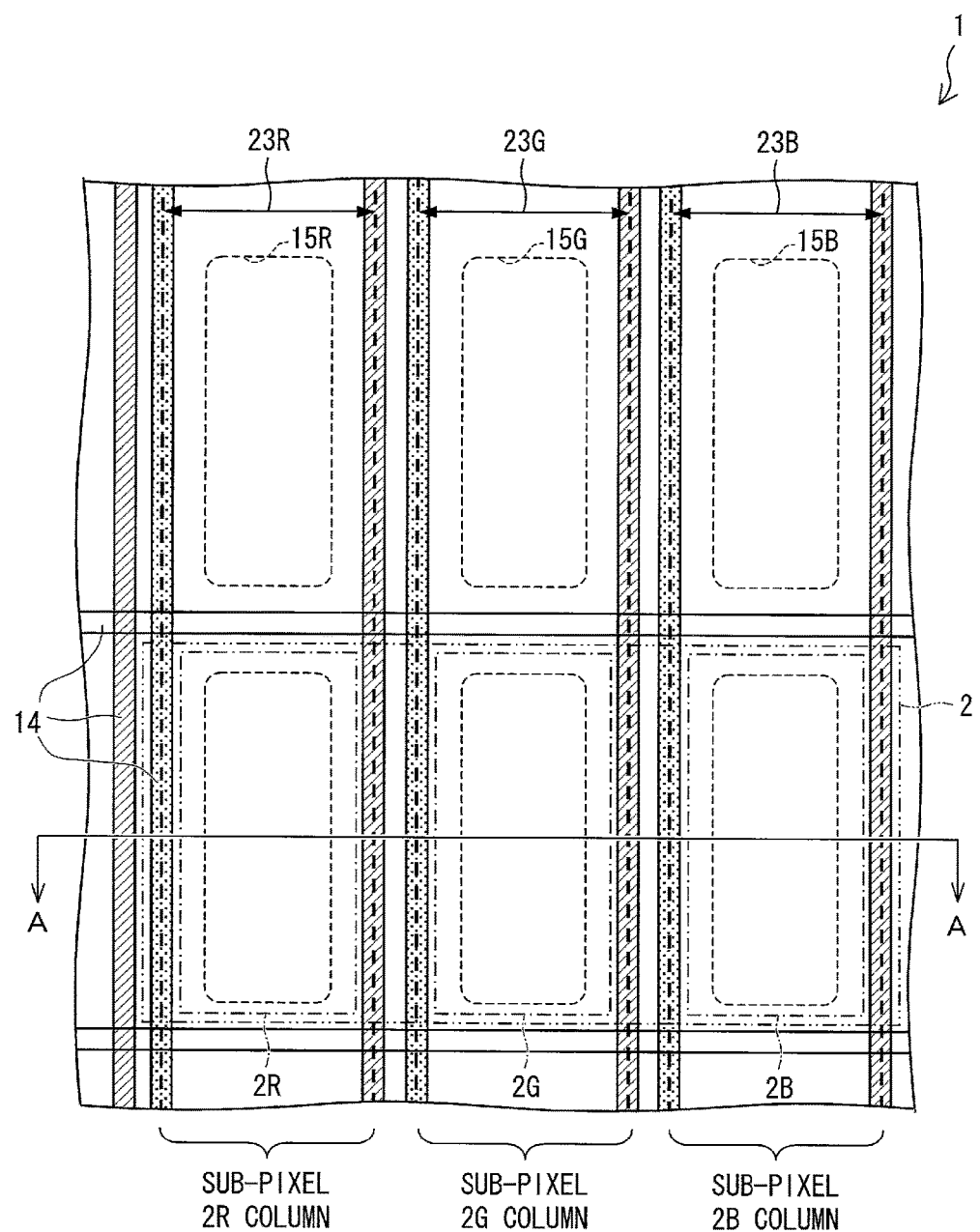

FIG. 7 is a plan view illustrating configurations of pixels constituting the organic EL display device illustrated in FIG. 6.

Figure 8:
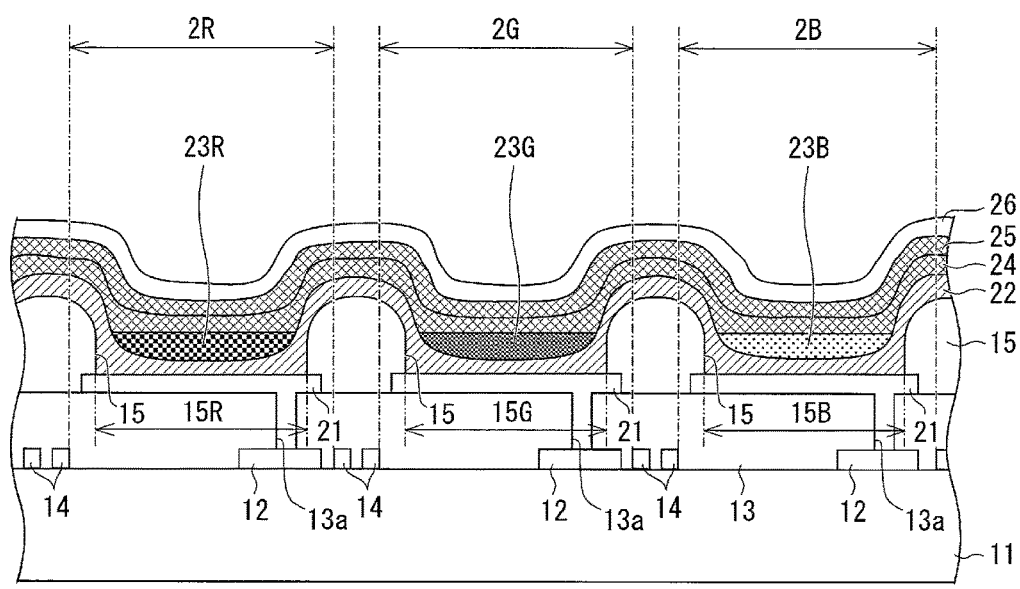

FIG. 8 is a cross-sectional view, taken long line A-A in FIG. 7, of a TFT substrate included in the organic EL display device illustrated in FIG. 7.

Figure 9:
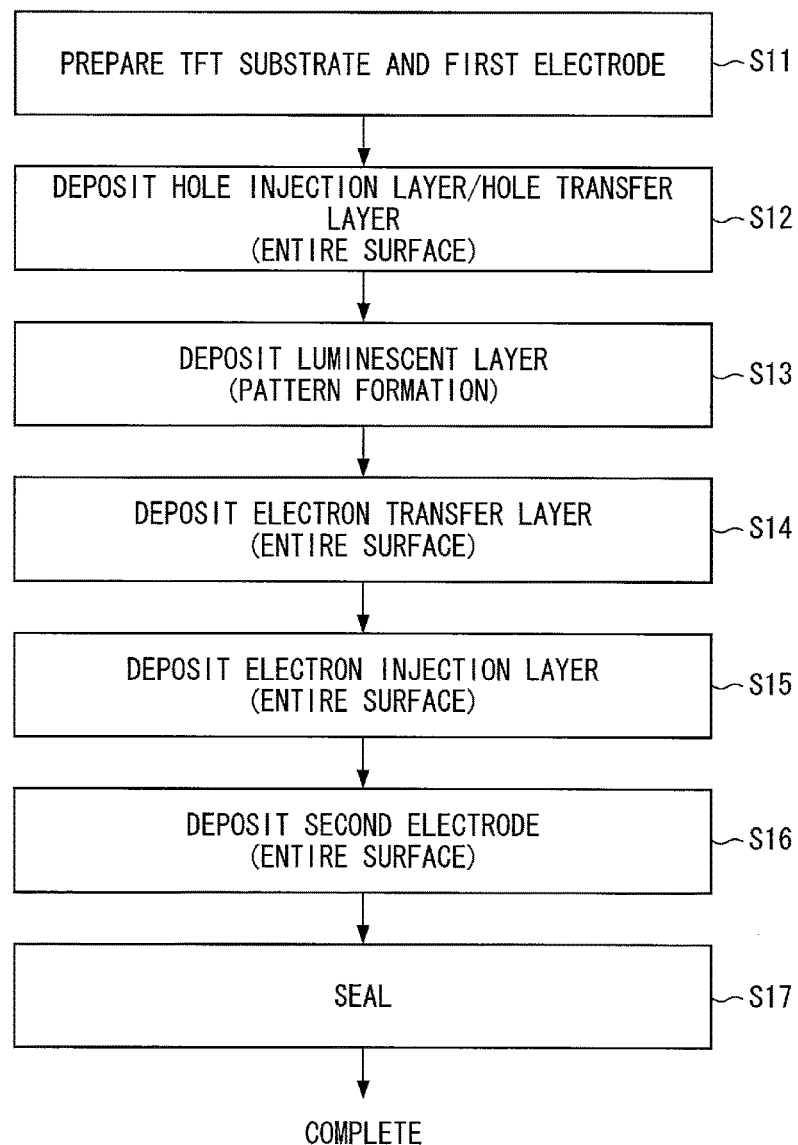

FIG. 9 is a flowchart showing successive steps for producing an organic EL display device in accordance with one embodiment of the present invention.

Figure 10:
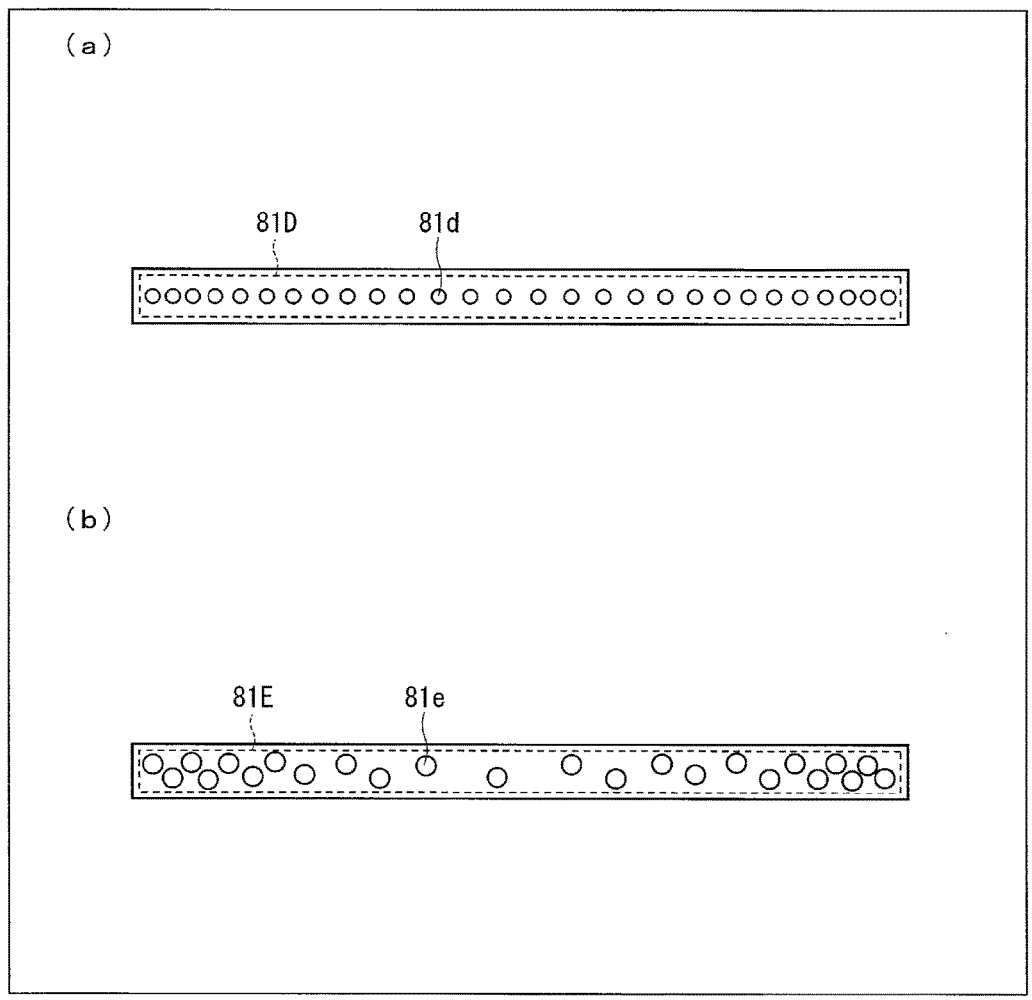

(a) and (b) of FIG. 10 are plan views each illustrating a modified example of a line of injection holes.

FIG. 11 is a view illustrating a modified example of a vapor deposition device.

Figure 12:
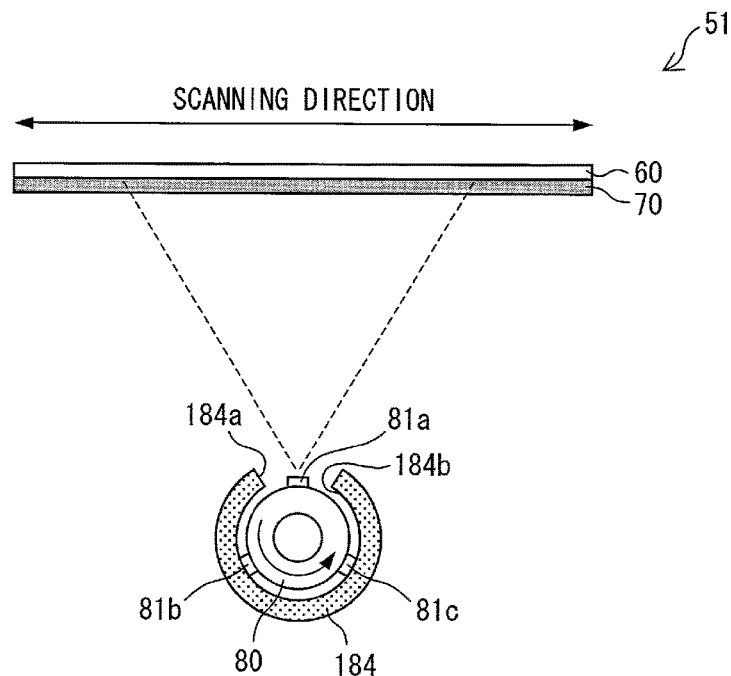

FIG. 12 is a cross-sectional view illustrating a part of a configuration of a vapor deposition device in accordance with another embodiment of the present invention.

Figure 13:
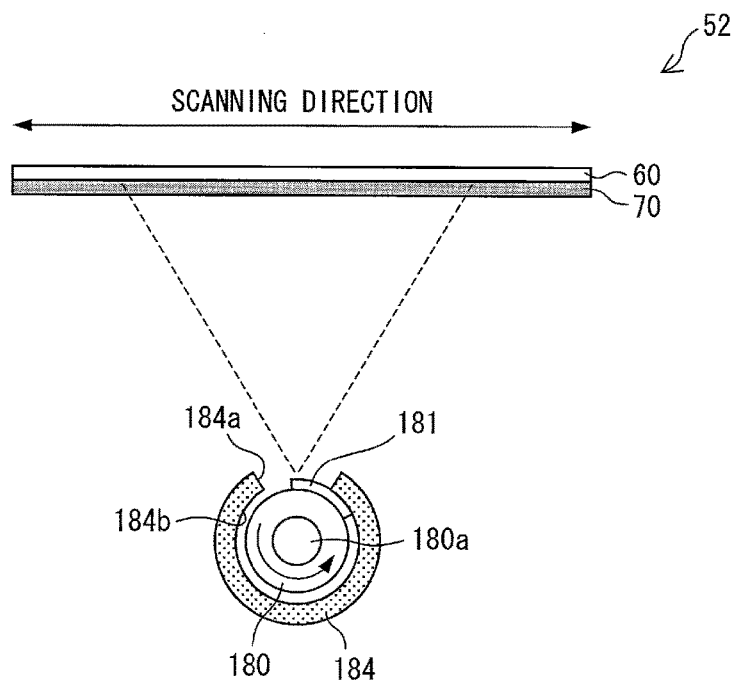

FIG. 13 is a cross-sectional view illustrating a part of a configuration of a vapor deposition device in accordance with a further embodiment of the present invention.

Figure 14:
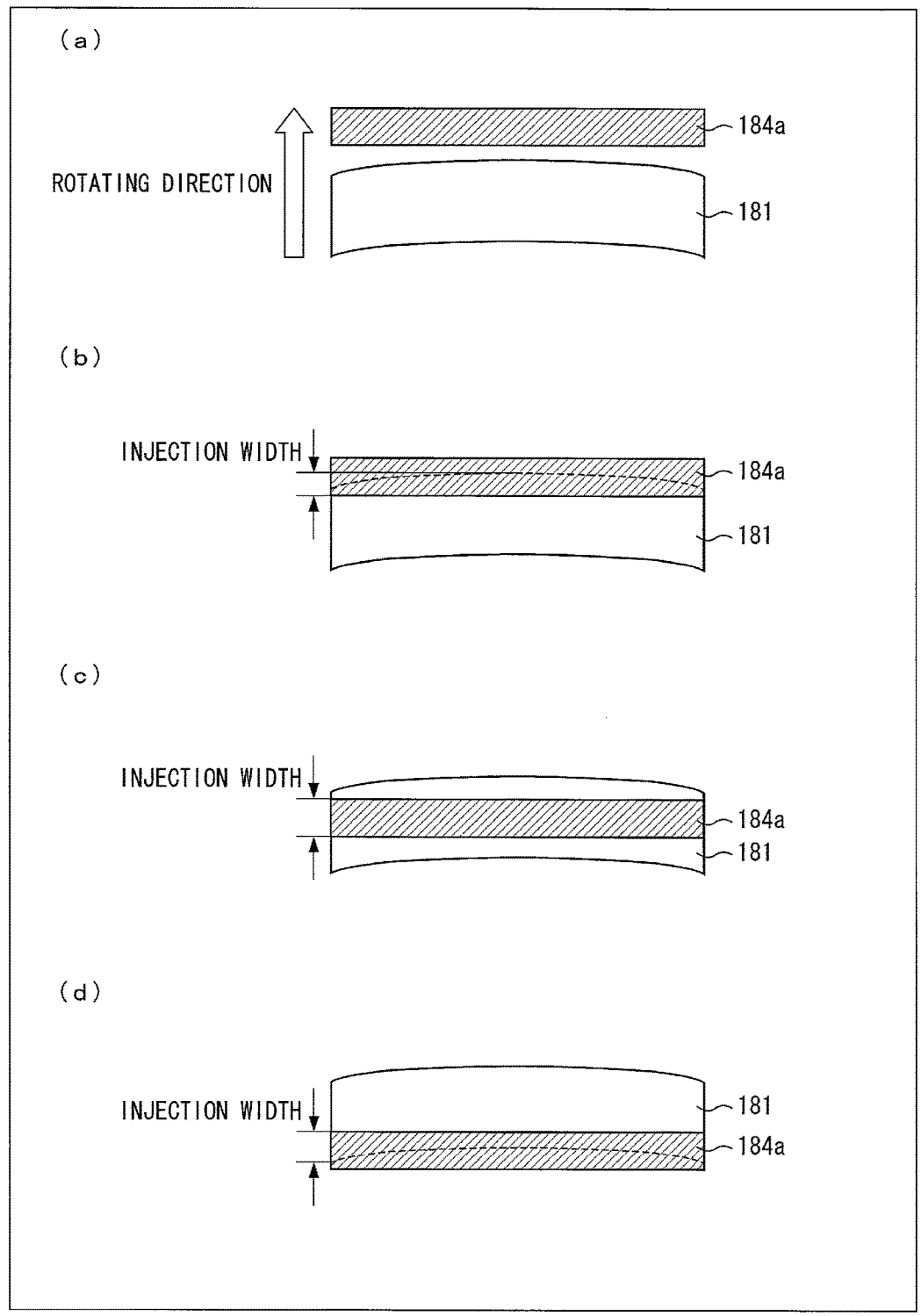

(a), (b) (c) and (d) of FIG. 14 are views each illustrating relative positions of an opening in a deposition preventing plate and an injection hole in a vapor deposition source, which are viewed from a film formation substrate-side.

Figure 15:
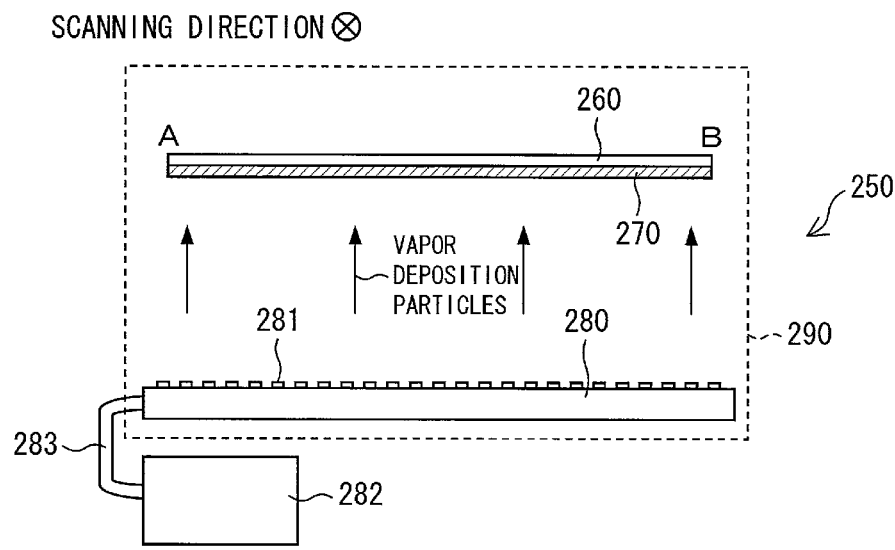

FIG. 15 is a side view schematically illustrating a configuration of a conventional vapor deposition device.

Figure 16:
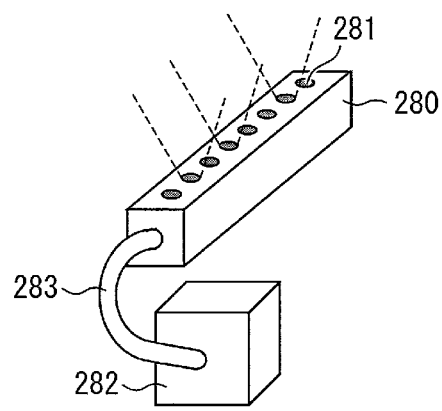

FIG. 16 is a perspective view schematically illustrating a configuration of a vapor deposition source unit of the vapor deposition device illustrated in FIG. 15.

FIG. 17 is a graph illustrating a relationship between (i) positions on a film formation substrate along a direction in which injection holes in a vapor deposition source are arranged and (ii) distribution (thickness) of vapor deposition particles.

DESCRIPTION OF EMBODIMENTS

Embodiments of the present invention are described below in detail.

[Embodiment 1]

An embodiment of the present invention is described below with reference to FIGS. 1 through 11.

The present embodiment describes, as an example vapor deposition method involving a vapor deposition device of the present embodiment, a method for producing an organic EL display device that (i) is of a bottom emission type, that is, extracts light from a TFT substrate side, and that (ii) carries out an RGB full color display.

The description first deals with the overall configuration of the organic EL display device.

FIG. 6 is a cross-sectional view schematically illustrating a configuration of the organic EL display device that carries out an RGB full color display. FIG. 7 is a plan view illustrating an arrangement of pixels included in the organic EL display device illustrated in FIG. 6. FIG. 8 is a cross-sectional view, taken along line A-A in FIG. 7, of a TFT substrate included in the organic EL display device illustrated in FIG. 7.

As illustrated in FIG. 6, the organic EL display device 1 produced in the present embodiment includes: a TFT substrate 10 including TFTs 12 (see FIG. 8); organic EL elements 20 provided on the TFT substrate 10 and connected to the TFTs 12; an adhesive layer 30; and a sealing substrate 40 arranged in that order.

The organic EL elements 20, as illustrated in FIG. 6, are contained between the TFT substrate 10 and the sealing substrate 40 by attaching the TFT substrate 10, on which the organic EL elements 20 are provided, to the sealing substrate 40 with use of the adhesive layer 30.

The organic EL display device 1, in which the organic EL elements 20 are contained between the TFT substrate 10 and the sealing substrate 40 as described above, prevents infiltration of oxygen, moisture and the like present outside into the organic EL elements 20.

As illustrated in FIG. 8, the TFT substrate 10 includes, as a supporting substrate, a transparent insulating substrate 11 such as a glass substrate. The insulating substrate 11 is, as illustrated in FIG. 7, provided with a plurality of wires 14 including (i) a plurality of gate lines laid in the horizontal direction and (ii) a plurality of signal lines laid in the vertical direction and intersecting with the gate lines. The gate lines are connected to a gate line driving circuit (not shown in the drawings) that drives the gate lines, whereas the signal lines are connected to a signal line driving circuit (not shown in the drawings) that drives the signal lines.

The organic EL display device 1 is a full-color, active matrix organic EL display device. The organic EL display device 1 includes, on the insulating substrate 11 and in regions defined by the wires 14, sub-pixels 2R, 2G, and 2B arranged in a matrix which include organic EL elements 20 of red (R), green (G), and blue (B), respectively.

In other words, the regions defined by the wires 14 each (i) correspond to a single sub-pixel (dot) and (ii) provide a luminescent region of R, G, or B for each sub-pixel.

A pixel 2 (that is, a single pixel) includes three sub-pixels: a red sub-pixel 2R transmitting red light; a green sub-pixel 2G transmitting green light; and a blue sub-pixel 2B transmitting blue light.

The sub-pixels 2R, 2G, and 2B include, as luminescent regions of the respective colors which luminescent regions perform light emission of the respective sub-pixels 2R, 2G, and 2B, openings 15R, 15G, and 15B that are covered respectively by stripe-shaped luminescent layers 23R, 23G, and 23B of the respective colors.

The luminescent layers 23R, 23G, and 23B are each formed in a pattern by vapor deposition. The openings 15R, 15G, and 15B are described below in detail.

The sub-pixels 2R, 2G, and 2B include respective TFTs 12 each connected to a first electrode 21 of a corresponding one of the organic EL elements 20. The sub-pixels 2R, 2G, and 2B each have an emission intensity that is determined by scan through the wires 14 and selection of the TFTs 12. As described above, the organic EL display device 1 carries out an image display by selectively causing the organic EL elements 20 to emit, by use of the TFTs 12, light with desired luminance.

The following describes in detail respective configurations of the TFT substrate 10 and each of the organic EL elements 20 both included in the organic EL display device 1.

The description below first deals with the TFT substrate 10.

The TFT substrate 10, as illustrated in FIG. 8, includes on a transparent insulating substrate 11 such as a glass substrate: TFTs 12 (switching elements); an interlayer film 13 (interlayer insulating film; planarizing film); and wires 14; and an edge cover 15, formed in that order.

The insulating substrate 11 is provided thereon with (i) wires 14 and (ii) TFTs 12 corresponding respectively to the sub-pixels 2R, 2G, and 2B. Since the configuration of a TFT has conventionally been well known, the individual layers of a TFT 12 are not illustrated in the drawings or described herein.

The interlayer film 13 is provided on the insulating substrate 11 throughout the entire region of the insulating substrate 11 to cover the TFTs 12.

There are provided on the interlayer film 13 first electrodes 21 of the organic EL elements 20.

The interlayer film 13 has contact holes 13a for electrically connecting the first electrodes 21 of the organic EL elements 20 to the TFTs 12. This electrically connects the TFTs 12 to the organic EL elements 20 via the contact holes 13a.

The edge cover 15 is an insulating layer for preventing a first electrode 21 and a second electrode of a corresponding organic EL element 20 from short-circuiting with each other due to, for example, (i) a reduced thickness of the organic EL layer in an edge section of the pattern of the first electrode 21 or (ii) an electric field concentration.

The edge cover 15 is so formed on the interlayer film 13 as to cover edge sections of the pattern of the first electrode 21.

The edge cover 15 has openings 15R, 15G, and 15B for the sub-pixels 2R, 2G, and 2B, respectively. The openings 15R, 15G, and 15B of the edge cover 15 define the respective luminescent regions of the sub-pixels 2R, 2G, and 2B.

The sub-pixels 2R, 2G, and 2B are, in other words, isolated from one another by the insulating edge cover 15. The edge cover 15 thus functions as an element isolation film as well.

The description below now deals with each of the organic EL elements 20.

Each of the organic EL elements 20 is a light-emitting element capable of high-luminance light emission based on low-voltage direct-current driving, and includes: a first electrode 21; an organic EL layer; and a second electrode 26, provided on top of one another in that order.

The first electrode 21 is a layer having the function of injecting (supplying) positive holes into the organic EL layer. The first electrode 21 is, as described above, connected to a corresponding TFT 12 via a corresponding contact hole 13a.

The organic EL layer provided between the first electrode 21 and the second electrode 26 includes, as illustrated in FIG. 8: a hole injection layer/hole transfer layer 22; luminescent layers 23R, 23G, and 23B; an electron transfer layer 24; and an electron injection layer 25, formed in that order from the first electrode 21 side.

The above stack order intends to use (i) the first electrode 21 as an anode and (ii) the second electrode as a cathode. The stack order of the organic EL layer is reversed in the case where the first electrode serves as a cathode and the second electrode 26 serves as an anode.

The hole injection layer has the function of increasing efficiency in injecting positive holes into the luminescent layers 23R, 23G, and 23B. The hole transfer layer has the function of increasing efficiency in transferring positive holes to the luminescent layers 23R, 23G, and 23B. The hole injection layer/hole transfer layer 22 is so formed uniformly throughout the entire display region of the TFT substrate 10 as to cover the first electrodes 21 and the edge cover 15.

The present embodiment describes an example case involving, as the hole injection layer and the hole transfer layer, a hole injection layer/hole transfer layer 22 that integrally combines a hole injection layer with a hole transfer layer as described above. The present embodiment is, however, not limited to such an arrangement: The hole injection layer and the hole transfer layer may be provided as separate layers independent of each other.

There are provided on the hole injection layer/hole transfer layer 22 the luminescent layers 23R, 23G, and 23B so formed in correspondence with the respective sub-pixels 2R, 2G, and 2B as to cover the respective openings 15R, 15G, and 15B of the edge cover 15.

The luminescent layers 23R, 23G, and 23B are each a layer that has the function of emitting light by recombining (i) holes (positive holes) injected from the first electrode 21 side with (ii) electrons injected from the second electrode 26 side. The luminescent layers 23R, 23G, and 23B are each made of a material with high luminous efficiency, such as a low-molecular fluorescent dye and a metal complex.

The electron transfer layer 24 is a layer that has the function of increasing efficiency in transferring electrons from the second electrode 26 to the luminescent layers 23R, 23G, and 23B. The electron injection layer 25 is a layer that has the function of increasing efficiency in injecting electrons from the second electrode 26 into the luminescent layers 23R, 23G, and 23B.

The electron transfer layer 24 is so provided on the luminescent layers 23R, 23G, and 23B and the hole injection layer/hole transfer layer 22 uniformly throughout the entire display region of the TFT substrate 10 as to cover the luminescent layers 23R, 23G, and 23B and the hole injection layer/hole transfer layer 22. The electron injection layer 25 is so provided on the electron transfer layer 24 uniformly throughout the entire display region of the TFT substrate 10 as to cover the electron transfer layer 24.

The electron transfer layer 24 and the electron injection layer 25 may be provided either (i) as separate layers independent of each other as described above or (ii) integrally with each other. In other words, the organic EL display device 1 may include an electron transfer layer/electron injection layer instead of the electron transfer layer 24 and the electron injection layer 25.

The second electrode 26 is a layer having the function of injecting electrons into the organic EL layer including the above organic layers. The second electrode 26 is so provided on the electron injection layer 25 uniformly throughout the entire display region of the TFT substrate 10 as to cover the electron injection layer 25.

The organic layers other than the luminescent layers 23R, 23G, and 23B are not essential for the organic EL layer, and may thus be included as appropriate in accordance with a required property of the organic EL element 20. The organic EL layer may further include a carrier blocking layer according to need. The organic EL layer can, for example, additionally include, as a carrier blocking layer, a hole blocking layer between the luminescent layers 23R, 23G, and 23B and the electron transfer layer 24 to prevent positive holes from transferring from the luminescent layers 23R, 23G, and 23B to the electron transfer layer 24 and thus to improve luminous efficiency.

The organic EL elements 20 can have, for example, any of the layered structures (1) through (8) below.

(1) first electrode/luminescent layer/second electrode
(2) first electrode/hole transfer layer/luminescent layer/electron transfer layer/second electrode
(3) first electrode/hole transfer layer/luminescent layer/hole blocking layer (carrier blocking layer)/electron transfer layer/second electrode
(4) first electrode/hole transfer layer/luminescent layer/hole blocking layer/electron transfer layer/electron injection layer/second electrode
(5) first electrode/hole injection layer/hole transfer layer/luminescent layer/electron transfer layer/electron injection layer/second electrode
(6) first electrode/hole injection layer/hole transfer layer/luminescent layer/hole blocking layer/electron transfer layer/second electrode
(7) first electrode/hole injection layer/hole transfer layer/luminescent layer/hole blocking layer/electron transfer layer/electron injection layer/second electrode
(8) first electrode/hole injection layer/hole transfer layer/electron blocking layer (carrier blocking layer)/luminescent layer/hole blocking layer/electron transfer layer/electron injection layer/second electrode As described above, the hole injection layer and the hole transfer layer, for example, may be integrated with each other. The electron transfer layer and the electron injection layer may be integrated with each other.

The structure of the organic EL element 20 is not limited to the above example layered structure, and may be a desired layered structure according to a required property of the organic EL element 20 as described above.

The description below deals with a method for producing the organic EL display device 1.

FIG. 9 is a flowchart indicating successive steps for producing the organic EL display device 1.

As illustrated in FIG. 9, the method of the present embodiment for producing the organic EL display device 1 includes steps such as a TFT substrate and first electrode preparing step (S11), a hole injection layer/hole transfer layer vapor deposition step (S12), a luminescent layer vapor deposition step (S13), an electron transfer layer vapor deposition step (S14), an electron injection layer vapor deposition step (S15), a second electrode vapor deposition step (S16), and a sealing step (S17).

The following describes, with reference to the flowchart illustrated in FIG. 9, the individual steps described above with reference to FIGS. 6 and 8.

Note, however, that the dimensions, materials, shapes and the like of the respective constituent elements described in the present embodiment merely serve as an embodiment, and that the scope of the present invention should not be construed limitedly on the grounds of such aspects of the constituent elements.

The stack order described in the present embodiment, as mentioned above, intends to use (i) the first electrode 21 as an anode and (ii) the second electrode 26 as a cathode. In the converse case where the first electrode 21 serves as a cathode and the second electrode 26 serves as an anode, the stack order of the organic EL layer is reversed, and the respective materials of the first electrode 21 and the second electrode 26 are switched similarly.

First, as illustrated in FIG. 8, the method of the present embodiment (i) applies a photosensitive resin onto an insulating substrate 11 that is made of a material such as glass and that includes, for example, TFTs 12 and wires 14 each formed by a publicly known technique, and (ii) carries out patterning with respect to the photosensitive resin by photolithography. This forms an interlayer film 13 on the insulating substrate 11.

The insulating substrate 11 is, for example, a glass or plastic substrate having (i) a thickness of 0.7 to 1.1 mm, (ii) a length (longitudinal length) of 400 to 500 mm along a y axis direction, and (iii) a length (lateral length) of 300 to 400 mm along an x axis direction. The insulating substrate 11 of the present embodiment was a glass substrate.

The interlayer film 13 can be made of, for example, an acrylic resin or a polyimide resin. The acrylic resin is, for example, a product in the Optomer series available from JSR Corporation. The polyimide resin is, for example, a product in the Photoneece series available from Toray Industries, Inc. Note that since a typical polyimide resin is not transparent but colored, the interlayer film 13 is more suitably made of a transparency resin such as an acrylic resin in the case where an organic EL display device of the bottom emission type is produced as the organic EL display device 1 as illustrated in FIG. 8.

The interlayer film 13 is simply required to have a film thickness that can compensate for the difference in level created by the TFTs 12. The film thickness is thus not particularly limited. The film thickness was, for example, approximately 2 μm in the present embodiment.

The method of the present embodiment next forms, in the interlayer film 13, contact holes 13a for electrically connecting the first electrodes 21 to the TFTs 12.

The method then forms, as a conductive film (electrode film), a film such as an ITO (indium tin oxide) film by a method such as a sputtering method so that the film has a thickness of 100 nm.

The method next applies a photoresist onto the ITO film, carries out patterning with respect to the photoresist by photolithography, and then carries out etching with respect to the ITO film with use of ferric chloride as an etchant. The method then strips the photoresist with use of a resist exfoliative solution, and further washes the substrate. This forms, on the interlayer film 13, first electrodes 21 in a matrix.

The conductive film material for the first electrode 21 is, for example, (i) a transparent conductive material such as ITO, IZO (indium zinc oxide), and gallium-added zinc oxide (GZO) or (ii) a metal material such as gold (Au), nickel (Ni), and platinum (Pt).

The above conductive film can be formed by, instead of the sputtering method, a method such as a vacuum vapor deposition method, a chemical vapor deposition (CVD) method, a plasma CVD method, and a printing method.

The thickness of the first electrodes 21 is not particularly limited. The first electrodes 21 can have a thickness of, for example, 100 nm as mentioned above.

The method next forms a pattern of an edge cover 15, as with the interlayer film 13, to have a film thickness of, for example, approximately 1 μm. The edge cover 15 can be made of an insulating material similar to that for the interlayer film 13.

The step described above prepares the TFT substrate 10 and the first electrode 21 (S11).

The method of the present embodiment next carries out, with respect to the TFT substrate 10 prepared through the above step, (i) a bake under a reduced pressure for dehydration and (ii) an oxygen plasma treatment for surface washing of the first electrode 21.

The method then carries out vapor deposition of a hole injection layer and a hole transfer layer (in the present embodiment, a hole injection layer/hole transfer layer 22) on the TFT substrate 10 throughout its entire display region with use of a conventional vapor deposition device (S12).

Specifically, the method (i) carries out an alignment adjustment, relative to the TFT substrate 10, of an open mask having an opening corresponding to the entire display region and (ii) closely attaches the open mask to the TFT substrate 10. The method then, while rotating the TFT substrate 10 and the open mask together, carries out, through the opening of the open mask and uniformly throughout the entire display region, vapor deposition of vapor deposition particles scattered from a vapor deposition source.

The above vapor deposition carried out throughout the entire display region refers to vapor deposition carried out unintermittently over sub-pixels having different colors and located adjacent to one another.

The hole injection layer and the hole transfer layer are each made of a material such as (i) benzine, styryl amine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, or a derivative of any of the above, (ii) a polysilane compound, (iii) a vinylcarbazole compound, (iv) and a monomer, an oligomer, or a polymer of an open chain conjugated system or a heterocyclic conjugated system, such as a thiophene compound and an aniline compound.

The hole injection layer and the hole transfer layer may be either integrated with each other as described above or formed as separate layers independent of each other. The hole injection layer and the hole transfer layer each have a film thickness of, for example, 10 to 100 nm.

The present embodiment used, as the hole injection layer and the hole transfer layer, a hole injection layer/hole transfer layer 22 that was made of 4,4'-bis [N-(1-naphthyl)-N-phenylamino]biphenyl(α-NPD) and that had a film thickness of 30 nm.

The method of the present embodiment next carries out a selective application formation (pattern formation) of luminescent layers 23R, 23G, and 23B on the hole injection layer/hole transfer layer 22 in correspondence with respective sub-pixels 2R, 2G, and 2B so that the luminescent layers 23R, 23G, and 23B cover respective openings 15R, 15G, and 15B of the edge cover 15 (S13).

As described above, the luminescent layers 23R, 23G, and 23B are each made of a material with high luminous efficiency, such as a low-molecular fluorescent dye and a metal complex.

The luminescent layers 23R, 23G, and 23B are each made of a material such as (i) anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or a derivative of any of the above, (ii) a tris(8-hydroxyquinolinate)aluminum complex, (iii) a bis (benzohydroxyquinolinate)beryllium complex, (iv) a tri (dibenzoylmethyl)phenanthroline europium complex, (v) and ditoluyl vinyl biphenyl.

The luminescent layers 23R, 23G, and 23B each have a film thickness of, for example, 10 to 100 nm.

The vapor deposition method and the vapor deposition device of the present embodiment are each particularly suitably used for a selective application formation (pattern formation) of such luminescent layers 23R, 23G, and 23B.

A description below deals in detail with a selective application formation of the luminescent layers 23R, 23G, and 23B which selective application formation involves the vapor deposition method and the vapor deposition device of the present embodiment.

The method of the present embodiment next carries out, in a manner similar to that described for the above hole injection layer/hole transfer layer vapor deposition step (S12), vapor deposition of an electron transfer layer 24 throughout the entire display region of the TFT substrate 10 so that the electron transfer layer 24 covers the hole injection layer/hole transfer layer 22 and the luminescent layers 23R, 23G, and 23B (S14).

The method then carries out, in a manner similar to that described for the above hole injection layer/hole transfer layer vapor deposition step (S12), vapor deposition of an electron injection layer 25 throughout the entire display region of the TFT substrate 10 so that the electron injection layer 25 covers the electron transfer layer 24 (S15).

The electron transfer layer 24 and the electron injection layer 25 are each made of a material such as a tris(8-hydroxyquinolinate)aluminum complex, an oxadiazole derivative, a triazole derivative, a phenylquinoxaline derivative, or a silole derivative.

Specific examples of the material include (i) Alq(tris(8-hydroxyquinoline)aluminum), anthracene, naphthalene, phenanthrene, pyrene, anthracene, perylene, butadiene, coumarin, acridine, stilbene, 1,10-phenanthroline, and a derivative or metal complex of any of the above, and (ii) LiF.

As mentioned above, the electron transfer layer 24 and the electron injection layer 25 may be either integrated with each other or formed as separate layers independent of each other. The electron transfer layer 24 and the electron injection layer 25 each have a film thickness of, for example, 1 to 100 nm. The respective film thicknesses of the electron transfer layer 24 and the electron injection layer 25 add up to, for example, 20 to 200 nm.

In the present embodiment, (i) the electron transfer layer 24 was made of Alq, whereas the electron injection layer 25 was made of LiF, and (ii) the electron transfer layer 24 had a film thickness of 30 nm, whereas the electron injection layer 25 had a film thickness of 1 nm.

The method of the present embodiment next carries out, in a manner similar to that described for the above hole injection layer/hole transfer layer vapor deposition step (S12), vapor deposition of a second electrode 26 throughout the entire display region of the TFT substrate 10 so that the second electrode 26 covers the electron injection layer 25 (S16).

The second electrode 26 is suitably made of a material (electrode material) such as a metal with a small work function. Examples of such an electrode material include a magnesium alloy (for example, MgAg), an aluminum alloy (for example, AlLi, AlCa, or AlMg) and calcium metal. The second electrode 26 has a thickness of, for example, 50 to 100 nm.

In the present embodiment, the second electrode 26 was made of aluminum and has a film thickness of 50 nm. The operation described above forms, on the TFT substrate 10, organic EL elements 20 each including the organic EL layer, the first electrode 21, and the second electrode 26 described above.

The method of the present embodiment then attached (i) the TFT substrate 10, on which the organic EL elements 20 is provided, to (ii) a sealing substrate 40 with use of an adhesive layer 30 as illustrated in FIG. 6 so that the organic EL elements 20 were contained.

The sealing substrate 40 is, for example, an insulating substrate such as a glass substrate and a plastic substrate and 0.4 to 1.1 mm in thickness. The sealing substrate 40 of the present embodiment was a glass substrate.

The longitudinal and lateral lengths of the sealing substrate 40 may each be adjusted as appropriate in accordance with the size of a target organic EL display device 1. The sealing substrate 40 may be an insulating substrate substantially equal in size to the insulating substrate 11 of the TFT substrate 10, in which case a combination of the sealing substrate 40, the TFT substrate 10, and the organic EL elements 20 contained therebetween is divided in accordance with the size of a target organic EL display device 1.

The method for containing the organic EL elements 20 is not limited to the method described above. Examples of other containing methods include (i) a method that uses a centrally depressed glass substrate as the sealing substrate 40 and that the combination of the sealing substrate 40 and the TFT substrate 10 is sealed along the edge in a frame shape with use of, for example, a sealing resin or fritted glass, and (ii) a method that fills a space between the TFT substrate 10 and the sealing substrate 40 with a resin. The method for producing the organic EL display device 1 does not depend on the above containing method, and can employ any of various containing methods.

The second electrode 26 may be provided thereon with a protective film (not shown) that covers the second electrode 26 and that prevents infiltration of oxygen, moisture and the like present outside into the organic EL elements 20.

The protective film is made of an electrically insulating or conductive material such as silicon nitride and silicon oxide. The protective film has a thickness of, for example, 100 to 1000 nm.

Through the above steps, the organic EL display device 1 is finally produced.

The organic EL display device 1 turns on a TFT upon receipt of a signal through a wire 14, and thus allows (i) holes (positive holes) to be injected from the first electrode 21 into the organic EL layer and also (ii) electrons to be injected from the second electrode 26 into the organic EL layer. This causes the positive holes and the electrons to recombine with each other inside the luminescent layers 23R, 23G, and 23B. The positive holes and the electrons thus recombined are emitted in the form of light when becoming inactive.

In the above organic EL display device 1, controlling respective light emission luminances of the sub-pixels 2R, 2G, and 2B allows a predetermined image to be displayed.

The following describes an arrangement of a vapor deposition device of the present embodiment.

Figure 1:
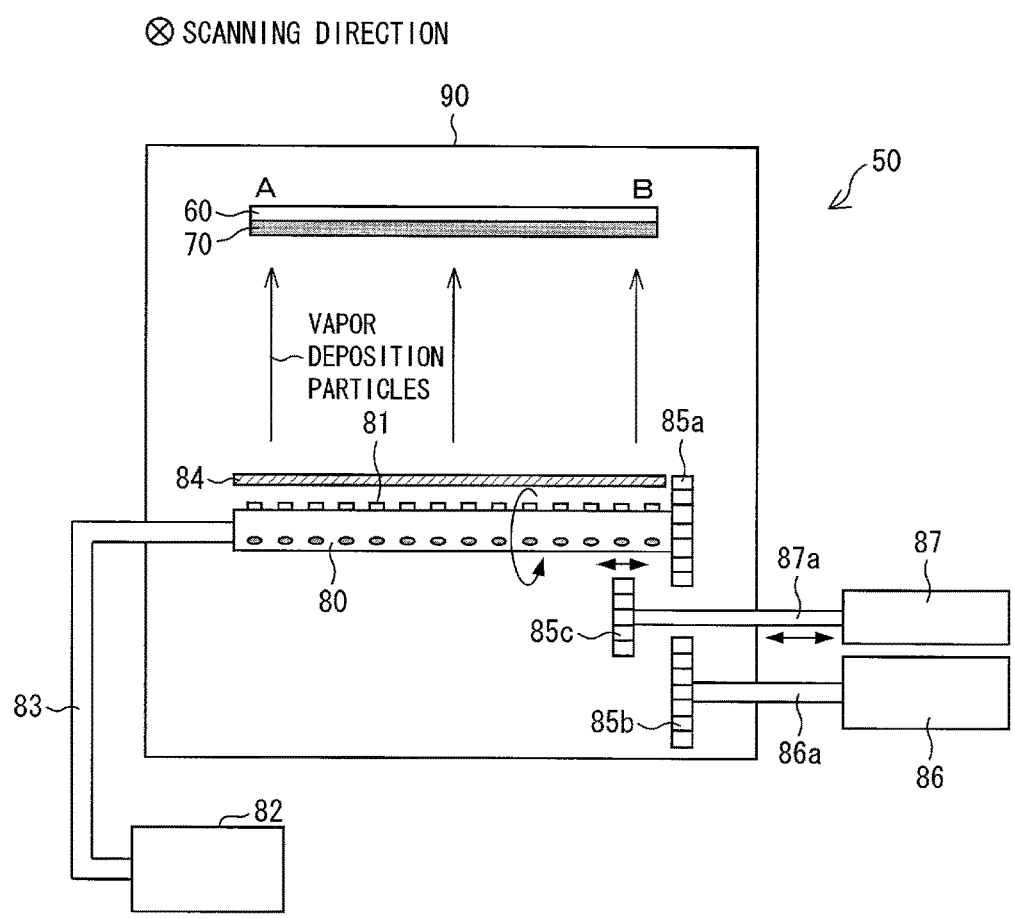
FIG. 1 is a side view illustrating a configuration of a vapor deposition device in accordance with one embodiment of the present invention.

FIG. 1 is a side view illustrating a configuration of a vapor deposition device 50 in accordance with the present embodiment. The vapor deposition device 50 is a device for forming a film on a film formation substrate 60. The vapor deposition device 50 includes a shadow mask 70, a vapor deposition source 80, a vapor deposition source crucible 82 (vapor deposition particle supplying means), a pipe 83, a deposition preventing plate 84, gears 85a to 85c (injection amount controlling means, line selecting means, rotating means), a rotation motor 86 (injection amount controlling means, line selecting means, rotating means), and a gear moving mechanism 87 (injection amount controlling means, line selecting means, rotating means).

The shadow mask 70, the vapor deposition source 80, the deposition preventing plate 84, and the gears 85a to 85c are provided in a vacuum chamber 90. The vapor deposition source crucible 82 is fixed to a support (not illustrated). Note that configurations of the film formation substrate 60, the shadow mask 70 and the vapor deposition source crucible 82 are the same as those of the film formation substrate 260, the shadow mask 270 and the vapor deposition source crucible 282 illustrated in FIG. 15, respectively.

The vapor deposition source 80 has injection holes 81 from which vapor deposition particles are injected. The injection holes 81 are arranged in a line along a one-dimensional direction (a longitudinal direction) of the vapor deposition source 80. There are a plurality of the lines of the injection holes 81 in a side face of the vapor deposition source 80 such that the lines are in parallel to each other. A further detailed configuration of the vapor deposition source 80 is described later.

The vapor deposition source crucible 82 contains a vapor deposition material in solid or liquid form. The vapor deposition source crucible 82 is provided outside the vacuum chamber 90. According to this arrangement, it is unnecessary to cause the vacuum chamber 90 to open to air each time the vapor deposition material is supplied to the vapor deposition source crucible 82, and thus makes it possible to improve throughput. Furthermore, the vacuum chamber 90 has more space therein. This makes it possible to easily locate members inside the vacuum chamber 90.

The vapor deposition material is heated in the vapor deposition source crucible 82 so as to be gaseous vapor deposition particles, and then the gaseous vapor deposition particles are supplied (introduced) to the vapor deposition source 80 via the pipe 83. The pipe 83 is connected to an end surface of the vapor deposition source 80 on a side where one end of the line of the injection holes 81 is located. The vapor deposition particles supplied to the vapor deposition source 80 are injected from the injection holes 81. Note that where to connect the pipe 83 is not limited to an end of the vapor deposition source 80.

The film formation substrate 60 and the vapor deposition source 80 are arranged so that a vapor-deposited surface of the film formation substrate 60 and the vapor deposition source 80 face each other. The shadow mask 70, which has an opening corresponding to a pattern of a vapor deposition region, is fixed tightly to the vapor-deposited surface of the film formation substrate 60 so that the vapor deposition particles are prevented from adhering to a region other than an intended vapor deposition region. While the vapor deposition particles are injected from the injection holes 81, the film formation substrate 60 and the shadow mask 70 are moved (scanned) relative to the vapor deposition source 80 by scanning means (not illustrated). Specifically, while the vapor deposition source 80 is injecting the vapor deposition particles towards the film formation substrate 60, moving means moves the film formation substrate 60 and the shadow mask 70 back and forth along a direction perpendicular to a direction in which the injection holes 81 are arranged (i.e., in a direction going away from a viewer of FIG. 1 and in a direction coming back toward the viewer of FIG. 1). This forms a predetermined pattern on the film formation substrate 60.

Figure 2:
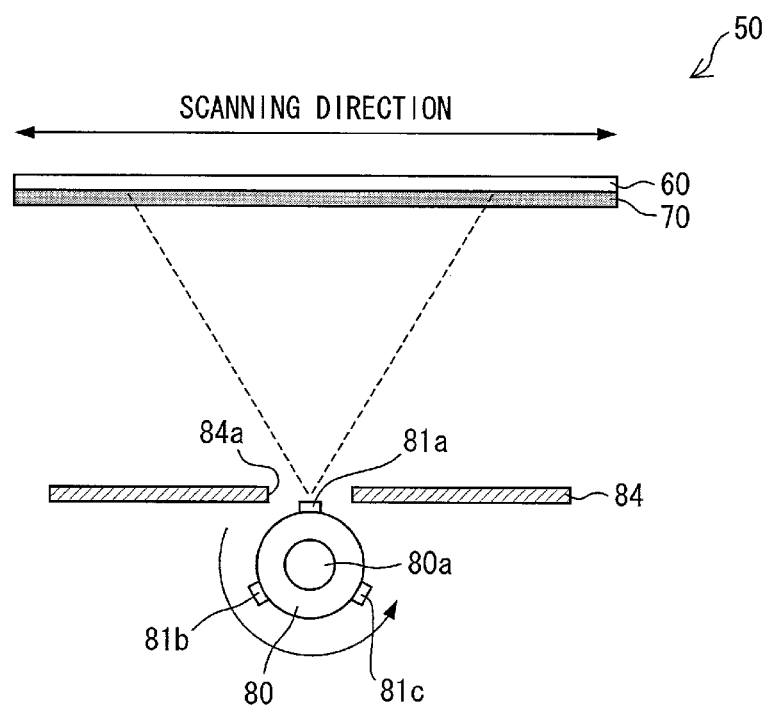
FIG. 2 is a cross-sectional view illustrating a part of the configuration of the vapor deposition device illustrated in FIG. 1.

FIG. 2 is a cross-sectional view, showing the film formation substrate 60, the shadow mask 70, the vapor deposition source 80 and the deposition preventing plate 84, which is taken along a plane perpendicular to the direction in which the injection holes 81 are arranged. In FIG. 2, the film formation substrate 60 and the shadow mask 70 move back and forth in a lateral direction during vapor deposition.

The vapor deposition source 80 has a cylindrical shape, and has a center part 80a through which the vapor deposition particles supplied from the vapor deposition source crucible 82 pass. The vapor deposition source 80 further has, in its side face, a line of injection holes 81a (shown in (a) of FIG. 3), a line of injection holes 81b (shown in (b) of FIG. 3), and a line of injection holes 81c ((c) of FIG. 3), each of which is along the longitudinal direction of the vapor deposition source 80.

(a), (b) and (c) of FIG. 3 are plan views each illustrating an example of a line of injection holes in the side face of the vapor deposition source 80. (a) of FIG. 3 illustrates a line A constituted by the injection holes 81a, (b) of FIG. 3 illustrates a line B constituted by the injection holes 81b, and (c) of FIG. 3 illustrates a line C constituted by the injection holes 81c. Note that, in each of the lines of (a), (b) and (c) of FIG. 3, the vapor deposition particles are supplied to the left end of the vapor deposition source 80.

As illustrated in (a) of FIG. 3, the injection holes 81a which constitute the line A have the same opening diameter. On the other hand, as illustrated in (b) of FIG. 3, the opening diameters of the injection holes 81b which constitute the line B gradually increase from the left end to the right end of the vapor deposition source 80. Furthermore, as illustrated in (c) of FIG. 3, the opening diameters of the injection holes 81c which constitute the line C gradually increase from the left end to a middle part of the vapor deposition source 80, and are the same from the middle part to the right end of the vapor deposition source 80. As such, the lines A to C are different from one another in distribution of the opening diameters of the injection holes.

In FIG. 2, the line A constituted by the injection holes 81a faces the film formation substrate 60. On the other hand, the line B constituted by the injection holes 81b and the line C constituted by the injection holes 81c do not face the film formation substrate 60. In other words, only vapor deposition particles injected from the injection holes 81a are deposited on the film formation substrate 60.

It is preferable to provide the deposition preventing plate 84 between the film formation substrate 60 and the vapor deposition source 80 so that vapor deposition particles injected from the injection holes 81b and the injection holes 81c do not reach the film formation substrate 60. The deposition preventing plate 84 has an opening 84a in the form of a slit, which extends along a direction in which the injection holes 81a are arranged. Only the vapor deposition particles injected from the injection holes 81a pass through the opening 84a and then deposited on the film formation substrate 60. As such, the deposition preventing plate 84 serves as vapor deposition preventing means for preventing vapor deposition particles, which are injected from injection holes in lines which do not face the film formation substrate 60, from being deposited on the film formation substrate 60. This makes it possible to form a film more uniformly.

Note that the deposition preventing plate 84 is preferably cooled so that vapor deposition particles which have adhered to the deposition preventing plate 84 do not fall off.

In the vapor deposition device 250 illustrated in FIG. 15, the vapor deposition source 280 is fixed. On the other hand, in the vapor deposition device 50 (shown in FIG. 1) in accordance with the present embodiment, the vapor deposition source 80 can be rotated so that a rotation axis of the vapor deposition source 80 is parallel to the longitudinal direction of the vapor deposition source 80. The vapor deposition device 80 is configured such that a line of injection holes that faces the film formation substrate 60 can be changed by rotating the vapor deposition source 80. In other words, it is possible to selectively cause one of the lines of the injection holes in the vapor deposition source 80 to face the film formation substrate 60.

As illustrated in FIG. 1, the vapor deposition source 80 is to be rotated by the gears 85a to 85c, the rotation motor 86, and the gear moving mechanism 87, which serve as a mechanism for rotating (rotating means) the vapor deposition source 80.

The gear 85a is provided at an end of the vapor deposition source 80 which end is opposite to an end to which the vapor deposition particles are supplied. The gear 85b is (i) provided at an end of a rotation shaft 86a which is to be rotated by the rotation motor 86 and (ii) separate from the gear 85a. The gear 85c is provided at an end of a rotation shaft 87a of the gear moving mechanism 87. The rotation shaft 87a is extendable along the longitudinal direction of the vapor deposition source 80 by the gear moving mechanism 87. Note that rotary surfaces of the gears 85a to 85c are parallel to each other.

The vapor deposition source 80 is rotated in the following manner. In a state illustrated in FIG. 1, the gear 85c is moved by the gear moving mechanism 87 to the right so that the gear 85c lies between the gear 85a and the gear 85b, and then the rotation motor 86 is driven. This causes the gear 85a and the gear 85b to be geared together, whereby driving force of the rotation motor 86 is transmitted to the vapor deposition source 80. On the other hand, the rotation of the vapor deposition source 80 is stopped in the following manner. The rotation motor 86 is stopped and the gear 85c is moved by the gear moving mechanism 87 to the left, whereby the gear 85c returns to the state illustrated in FIG. 1.

Since the gear 85c is selectively caused to lie between the gears 85a and 85b in this manner, it is possible to prevent heat from being conducted from the vapor deposition source 80, which is heated to high temperatures upon receiving vapor deposition particles, to the rotation motor 86 so that the rotation motor 86 is not damaged by the heat and the temperature of the vapor deposition source 80 does not decrease.

Note that, in a case where heat which is conducted from the vapor deposition source 80 to the rotation motor 86 only has small effects, the vapor deposition source 80 may be connected to the rotation motor 86 all the time without the gears 85a to 85c and the gear moving mechanism 87.

In the present embodiment, a line of injection holes that faces the film formation substrate 60 is changed when a direction in which the film formation substrate 60 is scanned is changed. FIG. 4 is a flowchart showing successive steps of vapor deposition onto the film formation substrate 60.

First, a line 81A is caused to face the film formation substrate 60 (S1, injection amount controlling step). Then, vapor deposition particles are injected from the injection holes 81a towards the film formation substrate 60 while the film formation substrate 60 is being scanned in a direction going away from the viewer of FIG. 1 (such a direction is referred to as a forth direction) (S2, injecting step).

After the completion of the scanning of the film formation substrate 60 in the forth direction, the vapor deposition source 80 is rotated so that a line 81B faces the film formation substrate 60 (S3, injection amount controlling step). In this state, vapor deposition particles are injected from the injection holes 81b towards the film formation substrate 60 while the film formation substrate 60 is being scanned in a direction coming back toward the viewer of FIG. 1 (such a direction is referred to as a back direction) (S4, injecting step).

After the completion of the scanning of the film formation substrate 60 in the back direction, the vapor deposition source 80 is rotated again so that a line 81C faces the film formation substrate 60 (S5, injection amount controlling step). In this state, vapor deposition particles are injected from the injection holes 81c towards the film formation substrate 60 while the film formation substrate 60 is being scanned in the forth direction (S6, injecting step). In this manner, the injection amount controlling step is performed a plurality of times and the injecting step is performed a plurality of times (repeating step). In the present embodiment, the injection amount controlling step is performed three times and the injecting step is performed three times. That is, vapor deposition is performed three times in total.

Note that the vapor deposition source 80 is rotated, after the film formation substrate 60 has passed over the vapor deposition source 80, while the film formation substrate 60 is in such a position that vapor deposition particles do not reach the film formation substrate 60. During the rotation of the vapor deposition source 80, it is preferable to stop the injection of vapor deposition particles with use of a valve and/or a shutter, because the vapor deposition particles may otherwise be injected to an unintended space.

Note here that, as illustrated in FIG. 3, the lines 81A to 81C are different from one another in distribution of the opening diameters of injection holes. Therefore, the lines 81A to 81C have respective different distributions, along the longitudinal direction of the vapor deposition source 80, of the injection amount of vapor deposition particles. Accordingly, a film thickness distribution across the film formation substrate 60 also differs among vapor depositions of S2, S4 and S6.

FIG. 5 is a graph illustrating a relationship between (i) positions on the film formation substrate 60 along a direction in which the injection holes are arranged and (ii) distribution (thickness) of vapor deposition particles. A solid line indicates a distribution of vapor deposition particles deposited when the film formation substrate 60 is scanned in the forth direction while the line 81A faces the film formation substrate 60 (first deposition). A dashed line indicates a distribution of vapor deposition particles deposited when the film formation substrate 60 is scanned in the back direction while the line 81B faces the film formation substrate 60 (second deposition). A dot-dash line indicates a distribution of vapor deposition particles deposited when the film formation substrate 60 is scanned in the forth direction while the line 81C faces the film formation substrate 60 (third deposition). Furthermore, a dot-dot-dash line indicates a distribution of vapor deposition particles after the completion of the third deposition.

Since the lines 81A to 81C are different from one another in distribution of the opening diameters of the injection holes, the distributions indicated by the solid line, the dashed line and the dot-dash line are different from one another. Furthermore, these distributions change in a complicated manner depending on various factors such as the type of vapor deposition particles and a temperature distribution in the vapor deposition source 80. Therefore, it is difficult to obtain uniform film thickness distribution by carrying out vapor deposition only one (1) time.

On the other hand, it is possible to cause the film thickness distributions to compensate for each other by carrying out vapor deposition a plurality of times with use of the lines different from one another in distribution, along the direction along which the injection holes are arranged, of the injection amount of vapor deposition particles. This makes it possible to obtain uniform film thickness distribution as shown by the dot-dot-dash line.

Note that, in the flowchart shown in FIG. 4, the vapor deposition is performed three times in total; however, the number of times the vapor deposition is performed is not limited to three. Furthermore, although each of the lines 81A to 81C is used once for vapor deposition onto the film formation substrate in the flowchart shown in FIG. 4, it is not necessary that the lines be used with equal frequency. By changing the frequency of use of the lines as needed, it is possible to change the film thickness distribution across the film formation substrate.

Note that the vapor deposition device of the present embodiment is obtained by merely modifying a conventional vapor deposition device by making a plurality of lines of injection holes in a vapor deposition source and adding a mechanism for rotating the vapor deposition source. Therefore, it is possible to easily control the film thickness distribution. Accordingly, it is not necessary to carry out highly-accurate processing to make the injection holes.

Furthermore, in the present embodiment, the lines have different distributions, along a direction along which the injection holes are arranged, of the injection amount of vapor deposition particles because the lines are different from one another in distribution of opening diameters of the injection holes. Note, however, that how to cause the lines to differ from one another in distribution of the injection amount of vapor deposition particles is not limited to the above. For example, like a line 81D illustrated in (a) of FIG. 10, injection holes 81d can be arranged at irregular intervals. Alternatively, like a line 81E illustrated in (b) of FIG. 10, injection holes 81e can be arranged with inconstant density. As described above, the distribution of the injection amount of vapor deposition particles can be caused to differ from line to line by arranging the lines such that the intervals between and/or the density of the injection holes in the longitudinal direction of the vapor deposition source are/is different from line to line.

In the present embodiment, the film formation substrate is in close contact with the shadow mask. Note, however, that vapor deposition can be carried out in a state where there is a gap between the film formation substrate and the shadow mask. Furthermore, although the shadow mask of the present embodiment covers the entire surface of the film formation substrate, this does not imply any limitation. For example, as illustrated in FIG. 11, a shadow mask 170 can be used which has a smaller area than a vapor deposition region of the film formation substrate 60.

In this case, vapor deposition is carried out in the following manner. The relative positions of the shadow mask 170 and the vapor deposition source 80 are fixed, and the shadow mask 170 and the vapor deposition source 80 are positioned so that the shadow mask 170 faces the film formation substrate with a certain gap between the shadow mask 170 and the film formation substrate. Then, the film formation substrate 60 is moved relative to the shadow mask 170 and the vapor deposition source 80, while vapor deposition particles are successively injected through openings 171 in the shadow mask 170 to the vapor deposition region of the film formation substrate 60.

Note that it is not necessary that the vapor deposition source have a cylindrical shape. For example, the vapor deposition source may have a tubular shape which has a polygonal cross section.

Furthermore, the number of the injection holes and the number of the lines are not limited to the above.

Furthermore, in the present embodiment, the entire vapor deposition source is rotated. Note, however, that the vapor deposition source can be configured such that (i) it is divided into a plurality of parts arranged along its longitudinal direction and (ii) the parts can be rotated independently of each other. In this case, (i) rotation gears are provided for the respective injection holes and (ii) the rotation gears are connected one by one to the rotation motor, whereby the injection holes are rotated independently of each other. This configuration also makes it possible to change the distribution of the injection amount of vapor deposition particles.

[Embodiment 2]

The following description will discuss another embodiment of the present invention with reference to FIG. 12. For convenience of description, members that have functions identical to those described in Embodiment 1 are given identical reference numerals, and are not described repeatedly.

FIG. 12 is a cross-sectional view illustrating a part of a configuration of a vapor deposition device 51 in accordance with the present embodiment. The vapor deposition device 51 is the same as the vapor deposition device 50 illustrated in FIG. 2 except that the vapor deposition device 51 includes a hot-wall deposition preventing plate 184 (injection preventing means) instead of the flat deposition preventing plate 84.

The deposition preventing plate 184 has a cylindrical shape. The deposition preventing plate 184 has an opening 184a in the form of a slit, which extends along a longitudinal direction of a vapor deposition source 80, in its side face so that the opening 184a faces a film formation substrate 60.

The vapor deposition source 80 is provided in a space surrounded by the deposition preventing plate 184 in such a manner that the vapor deposition source 80 is rotatable. There is provided rotating means (not illustrated) which can selectively cause one of the lines of injection holes, which are in the vapor deposition source 80, to face the film formation substrate 60. On the other hand, the deposition preventing plate 184 is fixed such that the opening 184a faces the film formation substrate 60.

During vapor deposition, (i) a line (in FIG. 12, a line of injection holes 81a), of the lines of the injection holes in the vapor deposition source 80, which faces the film formation substrate 60 is exposed to the outside through the opening 184a whereas (ii) the other line(s) (in FIG. 12, a line of injection holes 81b and a line of injection holes 81c) is/are closed with an inner wall 184b of the deposition preventing plate 184. This (i) allows vapor deposition particles to be injected from the injection holes 81a which face the film formation substrate 60 but (ii) does not allow vapor deposition particles to be injected from the injection holes 81b or 81c.

As described above, the deposition preventing plate 184 serves as the injection preventing means for preventing vapor deposition particles from being injected from injection holes in a line(s) which does/do not face the film formation substrate 60. This does not allow vapor deposition particles to be injected from injection holes that do not face the film formation substrate 60 in the vapor deposition device 51, thereby preventing injection of vapor deposition particles that are not used for forming a film. Accordingly, the vapor deposition device 51 allows for more effective use of vapor deposition particles than the vapor deposition device 50 illustrated in FIG. 2.

Note that it is preferable that the deposition preventing plate 184 is heated to a temperature above the sublimation temperature of vapor deposition particles so that the vapor deposition particles do not adhere to the deposition preventing plate 184.

Further note that the rotating means for rotating the vapor deposition source 80 is the same as that used in Embodiment 1.

[Embodiment 3]

The following description will discuss a further embodiment of the present invention with reference to FIGS. 13 and 14. For convenience of description, members that have functions identical to those described in Embodiments 1 and 2 are given identical reference numerals, and are not described repeatedly.

FIG. 13 is a cross-sectional view illustrating a part of a configuration of a vapor deposition device 52 in accordance with the present embodiment. The vapor deposition device 52 is the same as the vapor deposition device 51 illustrated in FIG. 12 except that the vapor deposition device 52 includes a vapor deposition source 180 instead of the vapor deposition source 80.

The vapor deposition source 180 has a cylindrical shape like the vapor deposition source 80 illustrated in FIG. 2. The vapor deposition source 180 is provided in a space surrounded by a deposition preventing plate 184 in such a manner that the vapor deposition source 180 can be rotated by rotating means (not illustrated). The vapor deposition source 180 has a center part 180a which serves as a passage through which vapor deposition particles supplied from a vapor deposition source crucible are to pass. Furthermore, the vapor deposition source 180 has an injection hole 181 in the form of a slit, which extends along a longitudinal direction of the vapor deposition source 180, in its side face.

When the injection hole 181 does not overlap an opening 184a in the deposition preventing plate 184, the injection hole 181 is closed with an inner wall 184b of the deposition preventing plate 184. Therefore, no vapor deposition particles are injected from the injection hole 181.

When the injection hole 181 at least partially overlaps the opening 184a in the deposition preventing plate 184, vapor deposition particles are injected from a region where the injection hole 181 and the opening 184a overlap each other. In other words, this region serves as an injection hole from which vapor deposition particles are to be injected. The injection amount of vapor deposition particles changes depending on the opening width of the region where the injection hole 181 and the opening 184a in the deposition preventing plate 184 overlap each other.

Note, here, that the opening 184a in the deposition preventing plate 184 has a rectangular shape, whereas the injection hole 181 has a non-rectangular shape whose long side(s) is/are not straight. That is, long sides of the opening 184a are not parallel to the long side(s) of the injection hole 181.

(a) through (d) of FIG. 14 are views each illustrating relative positions of the opening 184a and the injection hole 181 as viewed from a film formation substrate 60 side. The vapor deposition source 180 rotates in a direction from bottom to top of each drawing.

In (a) of FIG. 14, the injection hole 181 does not overlap the opening 184a. Therefore, no vapor deposition particles are injected from the injection hole 181.

(b) of FIG. 14 illustrates a state in which the injection hole 181 overlaps a part of the opening 184a. In this state, vapor deposition particles are injected from a region where the injection hole 181 and the part of the opening 184a overlap each other. Note, here, that the long sides of the opening 184a are straight whereas the long sides of the injection hole 181 are not straight. Therefore, the opening width of the region is not constant. In (b) of FIG. 14, the region has the largest opening width in its middle portion, and the opening width gradually decreases from the middle portion toward the ends of the region.

(c) of FIG. 14 illustrates a state in which the injection hole 181 overlaps the entire opening 184a. Since the opening 184a has a rectangular shape, the opening width of the region is constant.

(d) of FIG. 14 illustrates a state in which the injection hole 181 overlaps a part of the opening 184a. In (d) of FIG. 14, a region where the injection hole 181 overlaps the part of the opening 184a has the smallest opening width in its middle portion, and the opening width gradually increases from the middle portion toward the ends of the region.

The opening width of the region, which extends along the longitudinal direction of the vapor deposition source 180, where the injection hole 181 and the opening 184a overlap each other is different among (b) to (d) of FIG. 14. Therefore, a distribution, along the longitudinal direction of the vapor deposition source 180, of the injection amount of vapor deposition particles is also different among (b) to (d) of FIG. 14.

As described above, the present embodiment makes it possible, by rotating the vapor deposition source 180 so as to change the degree of overlapping of the injection hole 181 in the vapor deposition source 180 and the opening 184a in the deposition preventing plate 184 during vapor deposition, to very accurately change the distribution of the injection amount of vapor deposition particles which distribution is along the longitudinal direction of the vapor deposition source 180. Specifically, (i) the rotating means for rotating the vapor deposition source 180 and (ii) the opening 184a constitute opening width controlling means for changing the opening width of the injection hole from which vapor deposition particles are to be injected. This makes it possible, by carrying out vapor deposition a plurality of times while changing the distribution of the injection amount of vapor deposition particles in accordance with a direction in which the film formation substrate 60 is scanned, to cause the film thickness distributions to compensate for each other to thereby obtain a uniform film thickness.

Note that, although the injection hole in the vapor deposition source is larger than the opening in the deposition preventing plate in FIG. 14, the opening in the deposition preventing plate can be made so as to be larger than the injection hole in the vapor deposition source.

In the present embodiment, the opening in the deposition preventing plate has a rectangular shape whereas the injection hole in the vapor deposition source has a non-rectangular shape. Note, however, that the shapes of the opening in the deposition preventing plate and the injection hole in the vapor deposition source are not limited to the above. For example, the vapor deposition device can be arranged such that the opening in the deposition preventing plate has a non-rectangular shape and the injection hole in the vapor deposition source has a rectangular shape. Alternatively, the vapor deposition device can be arranged such that the opening in the deposition preventing plate and the injection hole in the vapor deposition source both have a non-rectangular shape.

The vapor deposition source can have a plurality of injection holes each of which is in the form of a slit. This makes it possible to more freely control the distribution of vapor deposition particles.

The rotating means for rotating the vapor deposition source 180 is the same as that used in Embodiment 1.

In the present embodiment, the deposition preventing plate has a cylindrical shape. Note, however, that this does not imply any limitation. For example, the deposition preventing plate can have a flat shape like the deposition preventing plate described in Embodiment 1.

In the present embodiment, the relative positions of the injection hole in the vapor deposition source and the opening in the deposition preventing plate are changed by rotating the vapor deposition source. Note, however, that this does not imply any limitation. For example, the vapor deposition device can be arranged such that the opening width of the region where the opening in the deposition preventing plate and the injection hole in the vapor deposition source overlap each other is changed by changing the relative positions of the opening in the deposition preventing plate and the injection hole in the vapor deposition source by moving the vapor deposition source or the deposition preventing plate in a horizontal direction that is perpendicular to the longitudinal direction of the vapor deposition source while the injection hole faces the film formation substrate.

(Additional Remarks)

In the above embodiments, in a case where an injection surface of the vapor deposition source is sufficiently large and the film formation substrate is relatively small, vapor deposition may be performed without moving the film formation substrate relative to the vapor deposition source.

Furthermore, although the above embodiments deal with an arrangement in which the longitudinal direction of the vapor deposition source is perpendicular to the direction in which the film formation substrate is scanned, the longitudinal direction of the vapor deposition source may deviate to some degree from a direction perpendicular to the direction in which the film formation substrate is scanned. Note however that, by arranging the vapor deposition device such that the longitudinal direction of the vapor deposition source is perpendicular to the direction in which the film formation substrate is scanned, it is possible to reduce the size of the vapor deposition source as much as possible and thus possible to reduce the size of the vapor deposition device.

The present invention is also applicable to a close-contact-scanning vapor deposition method, by which to carry out vapor deposition by sliding a film formation substrate while keeping the film formation substrate and a shadow mask in close contact to each other. Furthermore, the present invention is also applicable to a case where vapor deposition is carried out with respect to the entire surface of the film formation substrate without a shadow mask.

The present invention is applicable not only to vapor deposition of organic films, but also to vapor deposition of second electrodes and sealing films. Note however that, since unevenness in film thickness of an organic film has a larger impact on properties of an organic EL display device, the present invention is more effective for vapor deposition of the organic film.

On the other hand, unevenness in film thickness of a second electrode leads to unevenness in electrical resistance, whereas unevenness in film thickness of a sealing film leads to unevenness in moisture permeability and oxygen permeability. Provided that the influences of such unevenness on the properties of an organic EL element are minor, the present invention may be applied to only vapor deposition of organic films so that the structure of a vapor deposition device is simple and thus no increase occurs in cost of equipment.

(Main Points of the Invention)

As has been described, a vapor deposition device in accordance with one or more embodiments of the present invention is a vapor deposition device for forming a film on a film formation substrate, the vapor deposition including: a vapor deposition source that has an injection hole from which vapor deposition particles are injected; vapor deposition particle supplying means for supplying the vapor deposition particles to the vapor deposition source; and injection amount controlling means for changing a distribution of an injection amount of the vapor deposition particles.

As has been described, a vapor deposition method in accordance with one or more embodiments of the present invention is a vapor deposition method for forming a film on a film formation substrate, including the steps of: (a) controlling a distribution of an injection amount of vapor deposition particles from an injection hole in a vapor deposition source; (b) injecting the vapor deposition particles towards the film formation substrate from the injection hole while supplying the vapor deposition particles to the vapor deposition source; and (c) performing each of the steps (a) and (b) one or more times.

According to the above vapor deposition device and the vapor deposition method, the vapor deposition particles are supplied to the vapor deposition source from the vapor deposition particle supplying means, and injected from the injection hole towards the film formation substrate. Note, here, that a film thickness distribution of the vapor deposition particles obtained by one (1) vapor deposition is usually nonuniform; however, it is possible to cause film thickness distributions to compensate for each other by performing vapor deposition onto the film formation substrate a plurality of times while changing the distribution of the injection amount of vapor deposition particles. As such, it is possible to provide a vapor deposition device and a vapor deposition method each of which is capable of vapor deposition of vapor deposition particles on a film formation substrate such that a film made of the vapor deposition particles has a uniform thickness.

It is preferable that the vapor deposition device in accordance with one or more embodiments of the present invention is configured such that: a plurality of the injection holes are arranged in a line along a longitudinal direction of the vapor deposition source; a plurality of the lines of the plurality of injection holes are arranged in parallel to each other; the distribution, along the longitudinal direction, of the injection amount of the vapor deposition particles differs from line to line; and the injection amount controlling means is line selecting means for selectively causing one of the lines of the plurality of injection holes to face the film formation substrate.

According to the above configuration, the line selecting means selectively causes one of the lines each including the plurality of injection holes to face the film formation substrate. This makes it possible to change the distribution, along the longitudinal direction of the vapor deposition source, of the injection amount of vapor deposition particles.

It is preferable that the vapor deposition device in accordance with one or more embodiments of the present invention is configured such that: the vapor deposition source has a tubular shape; the vapor deposition source has the lines of the plurality of injection holes in its side face; and the line selecting means is rotating means for rotating the vapor deposition source so that a rotation axis of the vapor deposition source is parallel to the longitudinal direction.

According to the above configuration, the rotating means rotates the vapor deposition source which has a tubular shape. This makes it possible to selectively cause one of the lines each including the plurality of injection holes to face the film formation substrate.

It is preferable that the vapor deposition device in accordance with one or more embodiments of the present invention is configured such that: the rotating means includes a first gear provided at an end of the vapor deposition source, a second gear which is to be rotated by a rotation motor, and a third gear which is to be selectively caused to lie between the first gear and the second gear so as to cause the first gear and the second gear to be geared together.

According to the above configuration, the third gear is provided between the first gear and the second gear so as to cause the first gear and the second gear to be geared together. This makes it possible to rotate the vapor deposition source. Furthermore, since the vapor deposition source is separate from the rotation motor when the third gear is not provided between the first gear and the second gear, it is possible to prevent heat generated by the vapor deposition source from being conducted to the rotation motor.

The vapor deposition device in accordance with one or more embodiments of the present invention can be configured such that a distribution, along the longitudinal direction, of opening diameters of the plurality of injection holes differs from line to line.

The vapor deposition device in accordance with one or more embodiments of the present invention can be configured such that a distribution, along the longitudinal direction, of intervals between the plurality of injection holes differs from line to line.

The vapor deposition device in accordance with one or more embodiments of the present invention can be configured such that a distribution, along the longitudinal direction, of density of the plurality of injection holes differs from line to line.

Since the distribution of at least one of the following differs from line to line: the opening diameters of the plurality of injection holes; the intervals between the plurality of injection holes; and the density of the plurality of injection holes, it is possible to cause the distribution of vapor deposition particles to be injected to differ from line to line.

It is preferable that the vapor deposition device in accordance with one or more embodiments of the present invention further includes vapor deposition preventing means for preventing vapor deposition particles from being deposited on the film formation substrate, the vapor deposition particles being injected from injection holes in a line(s) which does/do not face the film formation substrate.

According to the above configuration, it is possible to prevent vapor deposition of the vapor deposition particles injected from injection holes in the line(s) which does/do not face the film formation substrate. This makes it possible to form a more uniform film.

It is preferable that the vapor deposition device in accordance with one or more embodiments of the present invention further includes injection preventing means for preventing vapor deposition particles from being injected from injection holes in a line(s), which does/do not face the film formation substrate, of the lines of the plurality of injection holes.

According to the above configuration, it is possible to prevent injection of vapor deposition particles that are not to be used for forming a film, and thus possible to effectively use vapor deposition particles.

It is preferable that the vapor deposition device in accordance with one or more embodiments of the present invention is configured such that: the injection preventing means is a deposition preventing plate which has a tubular shape; the vapor deposition source is provided in a space surrounded by the deposition preventing plate; and the deposition preventing plate has an opening in the form of a slit, which extends along the longitudinal direction of the vapor deposition source, in its side face so that the opening in the form of the slit faces the film formation substrate.

According to the above configuration, since only a line that faces the film formation substrate overlaps the opening in the form of a slit, it is possible to prevent vapor deposition particles from being injected from injection holes in the line(s) which does/do not face the film formation substrate.

It is preferable that the vapor deposition device in accordance with one or more embodiments of the present invention is configured such that: the injection hole is in the form of a slit extending along a longitudinal direction of the vapor deposition source; and the injection amount controlling means is opening width controlling means for changing an opening width of the injection hole.

According to the above configuration, the injection amount controlling means changes the opening width of the injection hole. This makes it possible to change the distribution of the injection amount of vapor deposition particles.

It is preferable that the vapor deposition device in accordance with one or more embodiments of the present invention is configured such that: the opening width controlling means includes a deposition preventing plate which has an opening in the form of a slit extending along the longitudinal direction of the vapor deposition source, the opening lying between the vapor deposition source and the film formation substrate; and moving means for changing relative positions of the injection hole in the form of the slit and the opening in the form of the slit.

According to the above configuration, the moving means changes the relative positions of the injection hole in the vapor deposition source and the opening in the deposition preventing plate. This causes the width of a region where the injection hole and the opening overlap each other to change as the relative positions of the injection hole and the opening change, thereby changing the opening width of the injection hole from which vapor deposition particles are injected.

It is preferable that the vapor deposition device in accordance with one or more embodiments of the present invention is configured such that: the vapor deposition source has a tubular shape; and the moving means is rotating means for rotating the vapor deposition source so that a rotation axis of the vapor deposition source is parallel to the longitudinal direction.

According to the above configuration, the rotating means rotates the vapor deposition source. This makes it possible to change the relative positions of the injection hole in the vapor deposition source and the opening in the deposition preventing plate.

It is preferable that the vapor deposition device in accordance with one or more embodiments of the present invention is configured such that: the deposition preventing plate has a tubular shape; the vapor deposition source is provided in a space surrounded by the deposition preventing plate; and the opening in the form of the slit is in a side face of the deposition preventing plate so as to face the film formation substrate.

According to the above configuration, the width of the region where the injection hole and the opening overlap each other changes when the vapor deposition source is rotated in the space surrounded by the deposition preventing plate.

It is preferable that the vapor deposition device in accordance with one or more embodiments of the present invention is configured such that a long side of the opening in the opening width control means is not parallel to a long side of the injection hole.

According to the above configuration, the opening width of the region where the injection hole and the opening overlap each other is not constant. This makes it possible to very accurately change the distribution, along the longitudinal direction of the vapor deposition source, of the injection amount of vapor deposition particles.

It is preferable that the vapor deposition device in accordance with one or more embodiments of the present invention further includes scanning means for causing the film formation substrate to move relative to the vapor deposition source.

According to the above configuration, it is possible to easily form a film on the film formation substrate whose vapor deposition region is larger than an injection surface of the vapor deposition source.

It is preferable that the vapor deposition device in accordance with one or more embodiments of the present invention is configured such that a/the longitudinal direction of the vapor deposition source is perpendicular to a direction in which the film formation substrate moves.

According to the above configuration, it is possible to easily carry out alignment of the vapor deposition source and the film formation substrate, and to reduce the size of the vapor deposition source and the size of the vapor deposition device.

A method for producing an organic electroluminescent display device in accordance with one or more embodiment of the present invention, including the steps of: (A) forming a first electrode on a TFT substrate; (B) depositing, over the TFT substrate, an organic layer including at least a luminescent layer; (C) depositing a second electrode; and (D) sealing, with a sealing member, an organic electroluminescent element including the organic layer and the second electrode, at least one of the steps (B), (C) and (D) including the steps (b), (a) and (c) of the vapor deposition method.

According to the above configuration, it is possible, by a vapor deposition method in accordance with one or more embodiments of the present invention, to form an organic layer etc. which has a uniform film thickness. Therefore, it is possible to provide an organic electroluminescent display device which causes less display unevenness.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is applicable not only to vapor deposition of vapor deposition particles in production of an organic EL display device, but also to vapor deposition of vapor deposition particles on any target.

REFERENCE SIGNS LIST

1 Organic EL display device (organic electroluminescent display device)
2 Pixel
2B Sub-pixel
2G Sub-pixel
2R Sub-pixel
10 TFT substrate
11 Insulating substrate
12 TFT
13 Interlayer film
13a Contact hole
14 Wire
15 Edge cover
15R Opening
15G Opening
15B Opening
20 Organic EL element
21 First electrode
22 Hole injection layer/hole transfer layer
23R Luminescent layer
23G Luminescent layer
23B Luminescent layer
24 Electron transfer layer
25 Electron injection layer
26 Second electrode
30 Adhesive layer
40 Sealing substrate
50 Vapor deposition device
51 Vapor deposition device
52 Vapor deposition device
60 Film formation substrate
70 Shadow mask
80 Vapor deposition source
80a Center part
81 Injection hole
81A Line
81B Line
81C Line
81D Line
81E Line
81a Injection hole
81b Injection hole
81c Injection hole
81d Injection hole
81e Injection hole
82 Vapor deposition source crucible (vapor deposition particle supplying means)
83 Pipe
84 Deposition preventing plate (Vapor deposition preventing means)
84a Opening
85a Gear (first gear, injection amount controlling means, line selecting means, rotating means)
85b Gear (second gear, injection amount controlling means, line selecting means, rotating means)
85c Gear (third gear, injection amount controlling means, line selecting means, rotating means)
86 Rotation motor (injection amount controlling means, line selecting means, rotating means)
86a Rotation shaft (injection amount controlling means, line selecting means, rotating means)
87 Gear moving mechanism (injection amount controlling means, line selecting means, rotating means)
87a Rotation shaft (injection amount controlling means, line selecting means, rotating means)
90 Vacuum chamber
170 Shadow mask
171 Opening
180 Vapor deposition source
180a Center part
181 Injection hole
184 Deposition preventing plate (injection preventing means)
184a Opening
184b Inner wall
250 Vapor deposition device
260 Film formation substrate
270 Shadow mask
280 Vapor deposition source
281 Injection hole
282 Vapor deposition source crucible
283 Pipe
290 Vacuum chamber

The invention claimed is:

1. A vapor deposition device for forming a film on a film formation substrate, the vapor deposition device comprising:
a vapor deposition source that has an injection hole from which vapor deposition particles are injected;
a crucible configured to supply the vapor deposition particles to the vapor deposition source; and
an injection controller configured to change a distribution of an injection amount of the vapor deposition particles, wherein:
the injection hole is in the form of a slit extending along a longitudinal direction of the vapor deposition source, and
the injection controller is further configured to change an opening width of the injection hole, wherein
the injection controller includes:
a deposition preventing plate which has an opening in the form of a slit extending along the longitudinal direction of the vapor deposition source, the opening lying between the vapor deposition source and the film formation substrate, and
an actuator configured to change relative positions of the injection hole in the form of the slit and the opening in the form of the slit, wherein
the injection amount of the vapor deposition particles changes depending on an opening width of an overlapping region at which the injection hole and the opening in the deposition preventing plate overlap each other, when viewed from a side of the film formation substrate, the opening in the deposition preventing plate has a rectangular shape, whereas the injection hole has a non-rectangular shape with two short sides that are parallel with each other and two long sides that are curved at a constant distance from each other so that each of the two long sides has a convex shape in a direction parallel to the two short sides, or the injection hole has a rectangular shape, whereas the opening in the deposition preventing plate has a non-rectangular shape with two short sides that are parallel with each other and two long sides that are curved at a constant distance from each other so that each of the two long sides has a convex shape in a direction parallel to the two short sides.

2. The vapor deposition device as set forth in claim 1, wherein:
the vapor deposition source has a tubular shape; and
the actuator is a rotation motor configured to rotate the vapor deposition source so that a rotation axis of the vapor deposition source is parallel to the longitudinal direction.

3. The vapor deposition device as set forth in claim 2, wherein:
the deposition preventing plate has a tubular shape;
the vapor deposition source is provided in a space surrounded by the deposition preventing plate; and
the opening in the form of the slit is in a side face of the deposition preventing plate so as to face the film formation substrate.

4. The vapor deposition device as set forth in claim 1, wherein the long sides of the opening in the injection controller is not parallel to the long sides of the injection hole.

5. A vapor deposition device as set forth in claim 1, further comprising a linear actuator configured to move the film formation substrate relative to the vapor deposition source.

6. The vapor deposition device as set forth in claim 1, wherein the longitudinal direction of the vapor deposition source is perpendicular to a direction in which the film formation substrate moves relative to the vapor deposition source.

7. The vapor deposition device as set forth in claim 1, wherein the opening width of the overlapping region is largest at a middle portion of the overlapping region, and gradually decreases from the middle portion towards ends of the overlapping region.

8. The vapor deposition device as set forth in claim 1, wherein the opening width of the overlapping region is smallest at a middle portion of the overlapping region, and gradually increases from the middle portion towards ends of the overlapping region.

9. The vapor deposition device as set forth in claim 1, wherein the injection hole is large than the opening in the deposition preventing plate.

10. The vapor deposition device as set forth in claim 1, wherein the opening in the deposition preventing plate is larger than the injection hole.

11. A vapor deposition method for forming a film on a film formation substrate with use of a vapor deposition device comprising:
a vapor deposition source that has an injection hole from which vapor deposition particles are injected;
a crucible configured to supply the vapor deposition particles to the vapor deposition source; and
an injection controller configured to change a distribution of an injection amount of the vapor deposition particles, wherein:
the injection hole is in the form of a slit extending along a longitudinal direction of the vapor deposition source, and
the injection controller is further configured to change an opening width of the injection hole, wherein
the injection controller includes:
a deposition preventing plate which has an opening in the form of a slit extending along the longitudinal direction of the vapor deposition source, the opening lying between the vapor deposition source and the film formation substrate, and
an actuator configured to change relative positions of the injection hole in the form of the slit and the opening in the form of the slit, wherein
the injection amount of the vapor deposition particles changes depending on an opening width of an overlapping region at which the injection hole and the opening in the deposition preventing plate overlap each other,
when viewed from a side of the film formation substrate, the opening in the deposition preventing plate has a rectangular shape, whereas the injection hole has a non-rectangular shape with two short sides that are parallel with each other and two long sides that are curved at a constant distance from each other so that each of the two long sides has a convex shape in a direction parallel to the two short sides, or the injection hole has a rectangular shape, whereas the opening in the deposition preventing plate has a non-rectangular shape with two short sides that are parallel with each other and two long sides that are curved at a constant distance from each other so that each of the two long sides has a convex shape in a direction parallel to the two short sides;
the method, comprising the steps of:
(a) controlling a distribution of an injection amount of vapor deposition particles from the injection hole in the vapor deposition source;
(b) injecting the vapor deposition particles towards the film formation substrate from the injection hole while supplying the vapor deposition particles to the vapor deposition source; and
(c) performing each of the steps (a) and (b) one or more times the distribution of the injection amount of the vapor deposition particles being changed in accordance with a direction in which the film formation substrate is scanned.

12. A method for producing an organic electroluminescent display device, comprising the steps of:
(A) forming a first electrode on a TFT substrate;
(B) depositing, over the TFT substrate, an organic layer including at least a luminescent layer;
(C) depositing a second electrode; and
(D) sealing, with a sealing member, an organic electroluminescent element including the organic layer and the second electrode, at least one of the steps (B), (C) and (D) including the steps (b), (a) and (c) of the vapor deposition method as set forth in claim 11.

* * * * *